US008900957B2

(12) United States Patent
Chung et al.

(10) Patent No.: US 8,900,957 B2
(45) Date of Patent: Dec. 2, 2014

(54) METHOD OF DUAL EPI PROCESS FOR SEMICONDUCTOR DEVICE

(71) Applicant: Taiwan Semiconductor Manufacturing Company, Ltd., Hsin-Chu (TW)

(72) Inventors: Han-Pin Chung, Fongshan (TW); Bor Chiuan Hsieh, Taoyuan (TW); Shiang-Bau Wang, Pingzchen (TW); Ming-Jie Huang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/088,033

(22) Filed: Nov. 22, 2013

(65) Prior Publication Data
US 2014/0073096 A1    Mar. 13, 2014

Related U.S. Application Data

(62) Division of application No. 12/721,399, filed on Mar. 10, 2010, now Pat. No. 8,609,497.

(60) Provisional application No. 61/303,853, filed on Feb. 12, 2010.

(51) Int. Cl.
| H01L 21/336 | (2006.01) |
| H01L 21/8234 | (2006.01) |
| H01L 21/8238 | (2006.01) |
| H01L 29/78 | (2006.01) |
| H01L 21/84 | (2006.01) |
| H01L 29/66 | (2006.01) |

(52) U.S. Cl.
CPC ..... *H01L 21/823487* (2013.01); *H01L 29/6653* (2013.01); *H01L 21/823864* (2013.01); *H01L 29/7848* (2013.01); *H01L 21/823814* (2013.01); *H01L 21/845* (2013.01); *H01L 21/823807* (2013.01); *H01L 29/78* (2013.01); *H01L 29/66628* (2013.01); *H01L 21/82385* (2013.01); *H01L 29/66636* (2013.01); *H01L 21/823821* (2013.01)
USPC ............................ 438/299; 438/230; 438/595

(58) Field of Classification Search
USPC .......... 257/288, 347, 351; 438/299, 183, 230, 438/595
See application file for complete search history.

(56) References Cited

U.S. PATENT DOCUMENTS

| 7,078,282 B2 * | 7/2006 | Chau et al. | 438/183 |
| 2011/0049630 A1 * | 3/2011 | Majumdar et al. | 257/351 |

* cited by examiner

*Primary Examiner* — Errol Fernandes
(74) *Attorney, Agent, or Firm* — Haynes and Boone, LLP

(57) ABSTRACT

The present disclosure provides a method of fabricating a semiconductor device that includes forming first and second gate structures over first and second regions of a substrate, respectively, forming spacers on sidewalls of the first and second gate structures, the spacers being formed of a first material, forming a capping layer over the first and second gate structures, the capping layer being formed of a second material different from the first material, forming a protection layer over the second region to protect the second gate structure, removing the capping layer over the first gate structure; removing the protection layer over the second region, epitaxially (epi) growing a semiconductor material on exposed portions of the substrate in the first region, and removing the capping layer over the second gate structure by an etching process that exhibits an etching selectivity of the second material to the first material.

12 Claims, 29 Drawing Sheets

METHOD OF DUAL EPI PROCESS FOR SEMICONDUCTOR DEVICE

PRIORITY DATA

The present application is a divisional application of U.S. patent application Ser. No. 12/721,399, filed Mar. 10, 2010, which claims priority to U.S. provisional patent application No. 61/303,853 filed on Feb. 12, 2010, each of which is hereby incorporated by reference in its entirety

BACKGROUND

When a semiconductor device such as a metal-oxide-semiconductor field-effect transistors (MOSFETs) is scaled down through various technology nodes, high-k dielectric material and metal are adopted to form a gate stack. In addition, strained source/drain features have been implemented using epitaxial (epi) silicon germanium (SiGe) to enhance carrier mobility and improve device performance in p-type devices. Further, raised source/drain features have been implemented using epi silicon (Si) in n-type devices. However, current techniques to perform dual epi process for n-type and p-type devices have not been satisfactory in all respects. For example, voids may be formed between the gate structure and the strained source/drain features during processing which can degrade device performance.

SUMMARY

An embodiment of the present invention involves a method of fabricating a semiconductor device. The method includes forming first and second gate structures over first and second regions of a substrate, respectively; forming spacers on sidewalls of the first and second gate structures, the spacers being formed of a first material; forming a capping layer over the first and second gate structures, the capping layer being formed of a second material different from the first material; forming a protection layer over the second region to protect the second gate structure; removing the capping layer over the first gate structure; removing the protection layer over the second region; epitaxially (epi) growing a semiconductor material on exposed portions of the substrate in the first region; and removing the capping layer over the second gate structure by an etching process that exhibits an etching selectivity of the second material to the first material.

Another embodiment of the present invention involves a method of fabricating a semiconductor device. The method includes forming first and second gate structures over first and second regions of a substrate, respectively; forming spacers on sidewalls of the first and second gate structures; forming a first capping layer over the first and second gate structures; forming a first protection layer over the second region to protect the second gate structure; removing the first capping layer over the first gate structure; removing the first protection layer over the second region; epitaxially (epi) growing a first semiconductor material on exposed portions of the substrate in the first region; removing the first capping layer over the second gate structure by wet etching, wherein the wet etching selectively etches the first capping layer but not the spacers disposed on the sidewalls of the first gate structure; forming a second capping layer over the first and second gate structures; forming a second protection layer over the first region to protect the first gate structure; removing the second capping layer over the second gate structure; forming a recess in the substrate at either side of the second gate structure; removing the second protection layer over the first gate structure; and epitaxially growing a second semiconductor material to fill the recess.

Yet another embodiment of the present invention involves a method of fabricating a semiconductor device. The method includes forming first and second gate structures over first and second regions of a substrate, respectively; forming spacers on sidewalls of the first and second gate structures; forming a first capping layer over the first and second gate structures; forming a second capping layer over the first capping layer; forming a first protection layer over the second region to protect the second gate structure; removing the first and second capping layers over the first gate structure; removing the first protection layer over the second region; epitaxially (epi) growing silicon on exposed portions of the substrate in the first region; removing the first and second capping layers over the second gate structure by wet etching, wherein the wet etching selectively removes the first and second capping layers but not the spacers disposed on the sidewalls of the first gate structure; forming a third capping layer over the first and second gate structures; forming a fourth capping layer over the third capping layer; forming a second protection layer over the first region to protect the first gate structure; removing the third and fourth capping layers over the second gate structure; etching a recess in the substrate at either side of the second gate structure; removing the second protection layer over the first region; epitaxially (epi) growing silicon germanium (SiGe) to fill the recess; and removing the third and fourth capping layers over the first gate structure by wet etching, wherein the wet etching selectively removes the third and fourth capping layers but not the spacers disposed on the sidewalls of the second gate structure.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
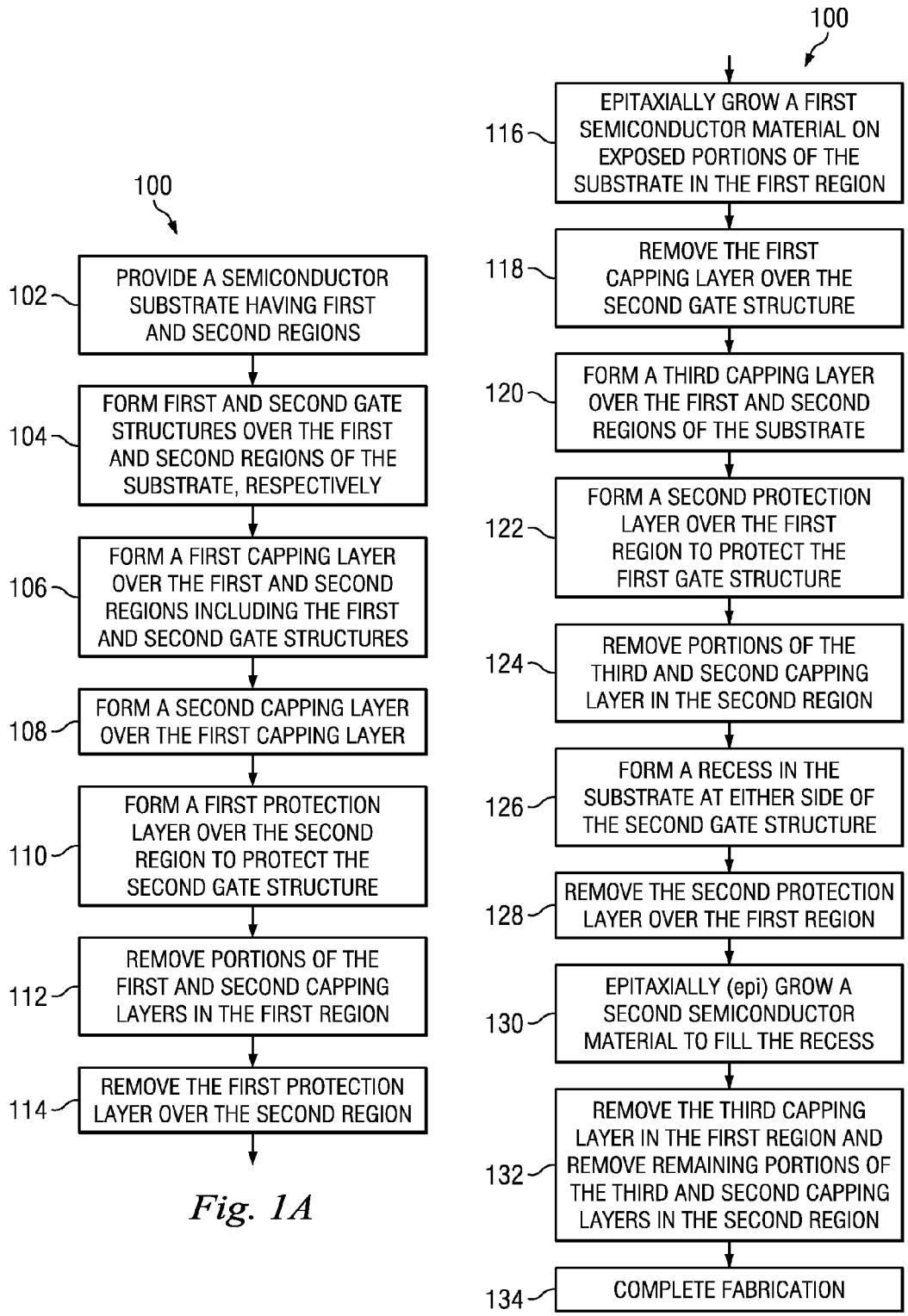
FIGS. 1A-1B illustrate a flow chart of a method of fabricating a semiconductor device with a dual epitaxial (epi) process according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a flowchart of a method 100 of fabricating a semiconductor device with a dual epitaxial (epi) process according to various aspects of the present disclosure. The method 100 begins with block 102 in which a semiconductor substrate having first and second regions is provided. The method 100 continues with block 104 in which first and second gate structures are formed over the first and second regions of the substrate, respectively. The method 100 continues with block 106 in which a first capping layer is formed over the first and second regions including the first and second gate structures. The method continues with block 108 in which a second capping layer is formed over the first capping layer. The method 100 continues with block 110 in which a first protection layer is formed over the second region to protect the second gate structure. The method 100 continues with block 112 in which portions of the first and second capping layers are removed in the first region. The remaining portions of the first and second capping layer are disposed on the sidewalls of the first gate structure. The method 100 continues with block 114 in which the first protection layer over the second region is removed.

The method 100 continues with block 116 in which a first semiconductor material is epitaxially grown on exposed portions of the substrate in the first region. The method 100 continues with block 118 in which the first capping layer over the second gate structure is removed. The method 100 continues with block 120 in which a third capping layer is formed over the first and second regions of the substrate. The method 100 continues with block 122 in which a second protection layer is formed over the first region to protect the first gate structure. The method 100 continues with block 124 in which portions of the third and second capping layers are removed in the second region. The remaining portions of the third and second capping layers are disposed on the sidewalls of the second gate structure. The method 100 continues with block 126 in which a recess is formed in the substrate at either side of the second gate structure. The method 100 continues with block 128 in which the second protection layer over the first region is removed. The method 100 continues with block 130 in which the third capping in the first region is removed, and the remaining portions of the third and second capping layers in the second region are removed. The method 100 continues with block 132 in which fabrication of the semiconductor device is completed. The discussion that follows illustrates various embodiments of a semiconductor device that can be fabricated according to the method 100 of FIG. 1.

Figure 2:
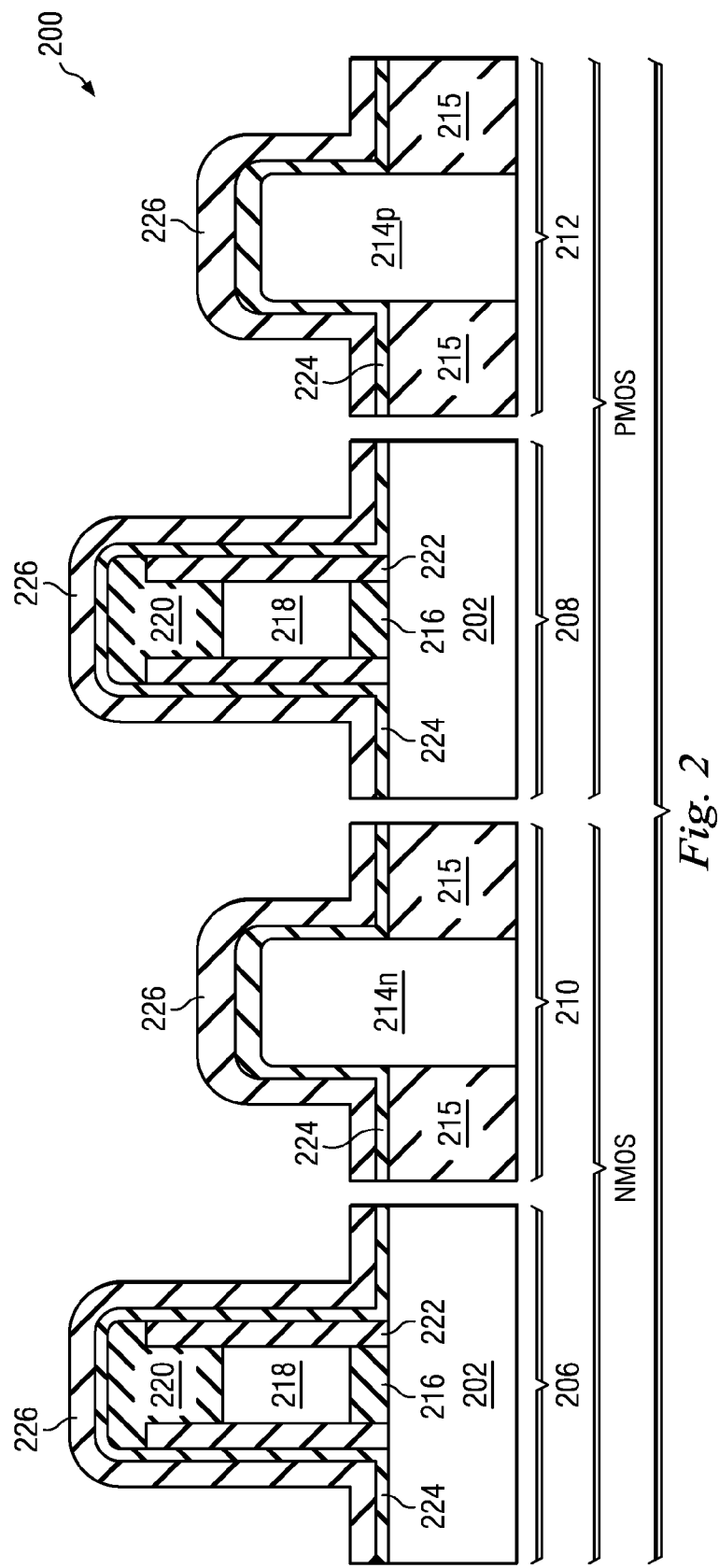
FIGS. 2-11 illustrate cross-sectional views of a semiconductor device at various stages of fabrication according to the method of FIGS. 1A-1B.

Referring FIGS. 2-11, illustrated are cross-sectional views of a semiconductor device 200 at various stages of fabrication according to the method 100 of FIG. 1. It should be noted that the semiconductor device 200 may be fabricated by CMOS technology. Accordingly, additional processes may be provided before, during, and after the method 100 of FIGS. 1A-1B, and that some process are only briefly described herein. It is understood that FIGS. 2-11 have been simplified for the sake of clarity to better understand the inventive concepts of the present disclosure. In FIG. 2, the semiconductor device 200 includes a substrate 202. The substrate 202 includes a silicon substrate. In another embodiment, the semiconductor substrate 202 may include an epitaxial layer. For example, the substrate 202 may have an epitaxial layer overlying a bulk semiconductor. The substrate 202 further includes doped regions such as p-wells and n-wells. Furthermore, the substrate 202 may include a semiconductor-on-insulator (SOI) structure such as a buried dielectric layer. Alternatively, the substrate 202 may include a buried dielectric layer such as a buried oxide (BOX) layer, such as that formed by a method referred to as separation by implantation of oxygen (SIMOX) technology, wafer bonding, selective epitaxial growth (SEG), or other proper method. The semiconductor device 200 includes active regions defined in the substrate 202.

Various shallow trench isolation (STI) structures are formed in the semiconductor substrate for isolating the various active regions. The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

One or more operational devices are formed in the active regions. The operational devices include n-type and p-type metal-oxide-semiconductor devices (NMOS and PMOS). The NMOS and PMOS devices may be fabricated by CMOS technology processing. The NMOS and PMOS devices may include planar field-effect transistor (FET) devices 206, 208 and non-planar transistor devices such as FinFET devices 210, 212. It is understood that both types of transistors are illustrated for the sake of example, and that the FinFET devices 210, 212 are shown across a fin structure whereas the FET devices 206, 208 are shown across a gate structure. The FinFET devices 210, 212 include fins 214 that extend from the substrate 202. Although only one fin is shown for the NMOS and PMOS devices 210, 212, it is understood that the number of fins may vary depending on the particular application. The fins $214n$, $214p$ may be fabricated by using suitable process such as photolithography and etch. For example, the photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to etch fins $214n$, $214p$ from the substrate 202. The fins $214n$, $214p$ may be etched using reactive ion etch (RIE) and/or other suitable processes. Shallow trench isolation (STI) structures 215 surround the fins $214n$, $214p$ and isolate each fin from the other fins. The fins $214n$, $214p$ may extend beyond the STI 215 at a distance ranging from about 300 to about 400 Angstrom (Å). The STI structures 215 may include any suitable insulating material.

In the present embodiment, each NMOS and PMOS devices 206, 208, 210, 212 includes a gate structure formed on the semiconductor substrate 202. It is understood that the FinFET devices 210, 212 may include more than one gate structure in multi-gate configurations. Although not shown, the gate structures wrap around the fins 214n, 214p allowing gate control of the channel from both sides of the fin. Further, the gate structure (not shown) of the FinFET devices 210, 212 may be similar to the gate structure of the FET devices 208, 206 except that the cross-section view would be along the fin 214n, 214p.

The gate structure includes a gate dielectric 216 and a gate electrode 218. The gate dielectric 216 may include silicon oxide, silicon nitride, high-k dielectric, or other suitable material. The high-k dielectric layer may include a binary or ternary high-k film such as HfOx. Alternatively, the high-k dielectric layer 216 may optionally include other high-k dielectrics such as LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides, or other suitable materials. The gate dielectric is formed by a suitable process such as an atomic layer deposition (ALD), chemical vapor deposition (CVD), physical vapor deposition (PVD), thermal oxidation, UV-ozone oxidation, or combinations thereof.

The gate electrode 218 may include polysilicon (or poly). For example, silane ($SiH_4$) may be used as a chemical gas in a CVD process to form the poly. The poly layer may include a thickness ranging from about 600 to about 800 angstrom (Å). The gate structure may further include a hard mask layer 220 formed on the gate electrode 218. The hard mask layer 220 includes silicon oxide. Alternatively, the hard mask layer 220 may optionally silicon nitride, silicon oxynitride, and/or other suitable dielectric materials, and may be formed using a method such as CVD or PVD. The hard mask layer 220 may include a thickness ranging from about 100 to about 400 angstrom (Å).

The semiconductor device 200 includes a sealing layer 222 formed on each sidewall of the gate structures. The sealing layer 222 includes silicon nitride and has a thickness ranging from about 5 to about 8 nm. The sealing layer 222 may be formed by CVD, PVD, ALD, plasma enhanced CVD (PECVD), or other suitable technique. In some embodiments, an ion implantation process may be performed to form lightly doped source/drain regions (LDD) in the substrate 202. The LDD regions (not shown) are aligned with the sidewall of the gate structure. The ion implantation process may utilize p-type dopants (e.g., B or In) for the PMOS devices and n-type dopants (P or As) for the NMOS devices.

An capping layer such as an oxide layer 224 is formed over the substrate 202 including over the gate structures and fins 214n, 214p. The oxide layer 224 may be formed by CVD, PVD, ALD, or other suitable technique. The oxide layer 224 includes a thickness ranging from about 3 nm to about 5 nm. In the present embodiment, the oxide layer 224 has a thickness of about 4 nm. Another capping layer such as a silicon nitride layer 226 is formed over the oxide layer 224. The nitride layer 226 may be formed by CVD, PVD, ALD, furnace-type processing, or other suitable technique. The silicon nitride layer 226 includes a thickness ranging from about 20 to about 30 nm. In the present embodiment, the nitride layer 226 has a thickness of about 25 nm.

Figure 3:
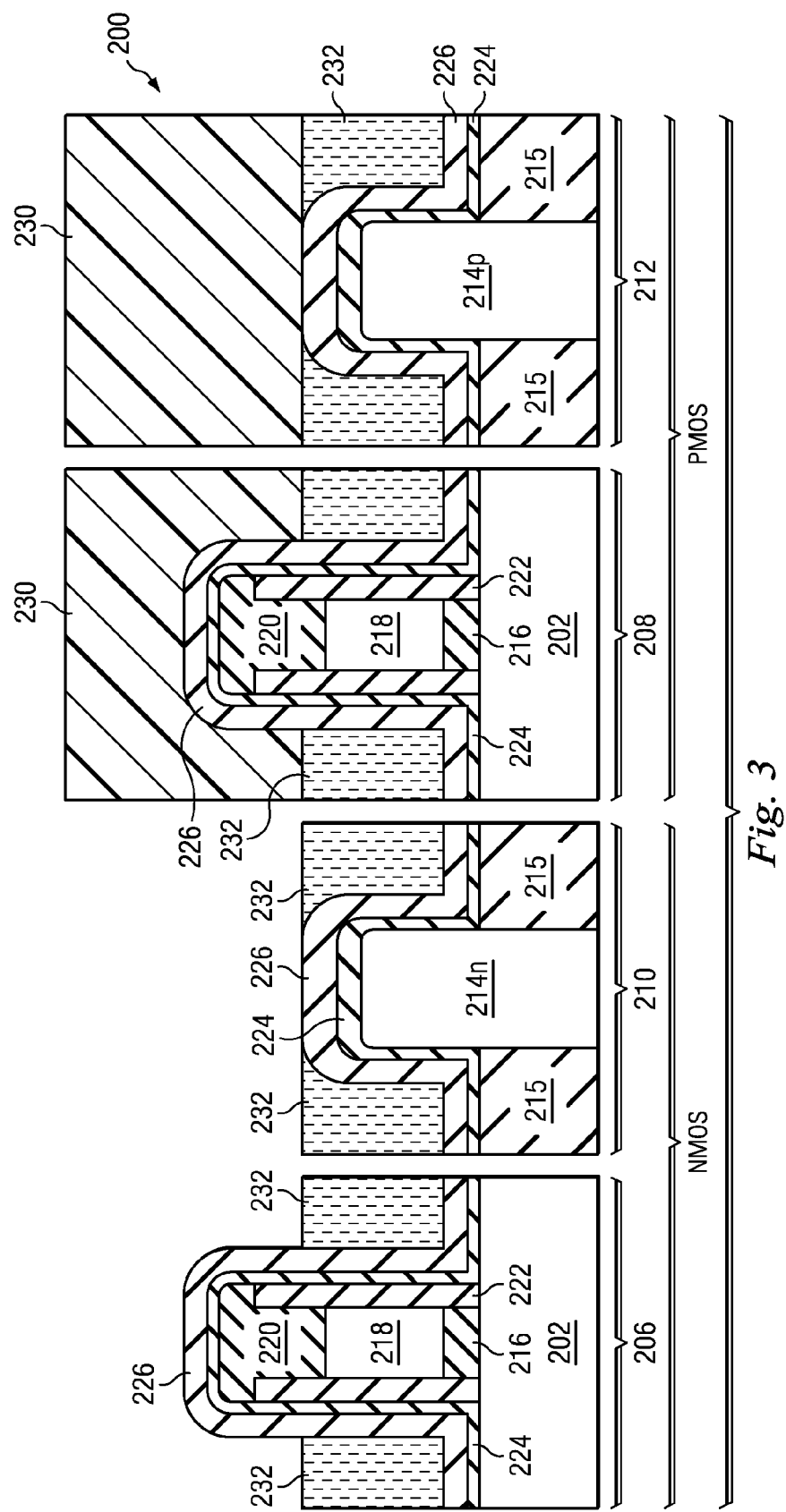

In FIG. 3, a patterned photoresist layer 230 is formed to protect the PMOS devices 208, 212. The patterned photoresist layer 230 may be formed by a photolithography process. An exemplary photolithography process may include processing steps of photoresist coating, soft baking, mask aligning, exposing, post-exposure baking, developing photoresist, and hard baking. The photolithography exposing process may also be implemented or replaced by other proper techniques such as maskless photolithography, electron-beam writing, ion-beam writing, and molecular imprint. In some embodiments, a bottom anti-reflective coating (BARC) layer 232 may be formed prior to forming the resist layer 230.

Figure 4:
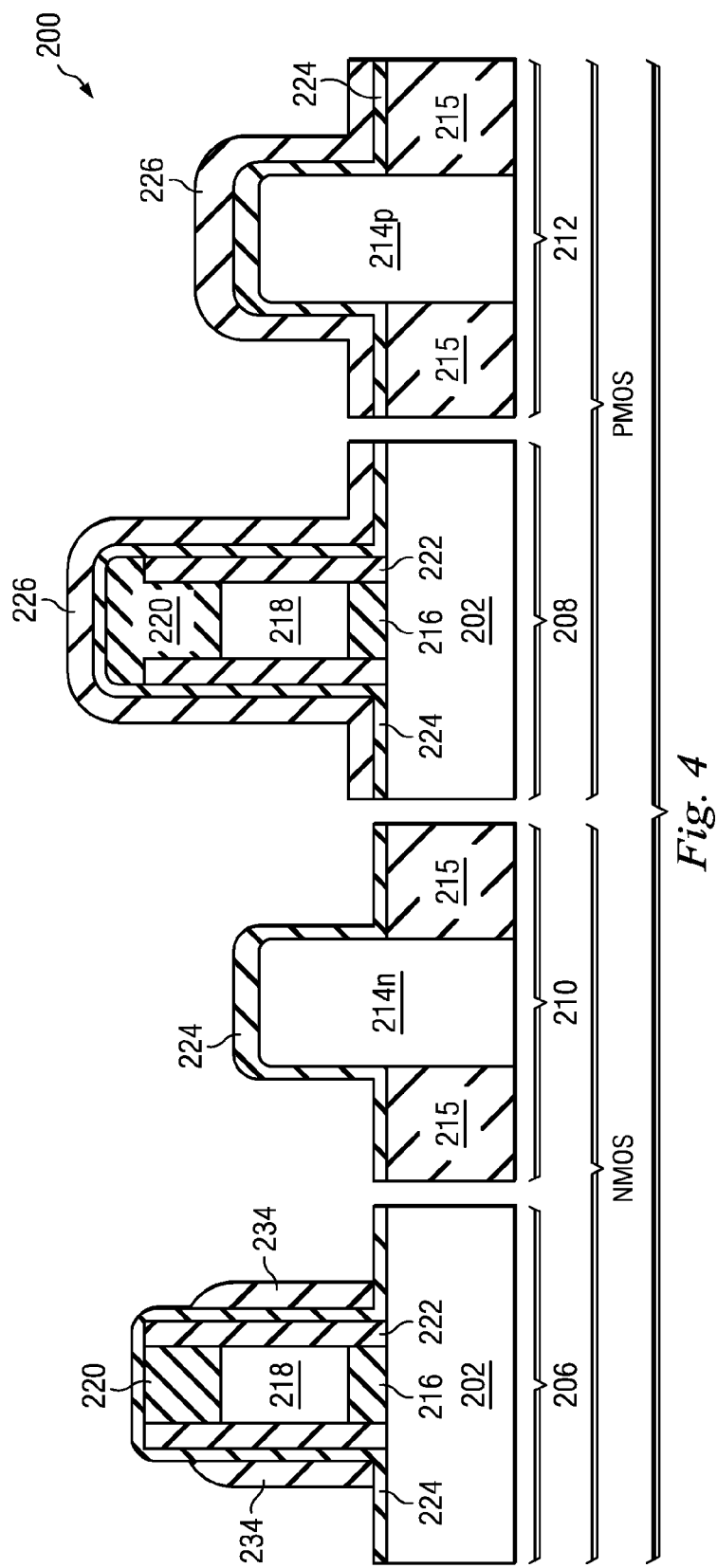

In FIG. 4, an etching process is performed to remove portions of the nitride layer 226 directly overlying the substrate 202 at either side of the gate structure of the NMOS device 206. It is noted that the nitride layer 226 over the fin 214n is completely removed due to the height difference between the gate structure and the fin. Further, the BARC layer 232 overlying the NMOS devices 206, 210 may be removed during the etching process. The patterned photoresist layer 230 protects the oxide layer 224 and the nitride layer 226 overlying the PMOS devices 208, 212 during the etching process. In the present embodiment, the etching process includes a dry etching process that utilizes a gas combination of CHxFy/O2 or SF6/CHxFy/He (where x=1 to 3 and y=4-x) or other suitable gas. With respect to the gas combination of CHxFy/O2, the dry etching process utilizes a pressure ranging from about 1 mT to about 1000 mT, a power ranging from about 500 W to about 3000 W, a bias voltage ranging from about 100 V to about 500 V, a CHxFy flow rate ranging from about 10 sccm to about 500 sccm, and an O2 flow rate ranging from about 10 sccm to about 500 sccm. With respect to the gas combination of SF6/CHxFy/He, the dry etching process utilizes a pressure ranging from about 1 mT to about 1000 mT, a power ranging from about 500 W to about 3000 W, a bias voltage ranging from about 0 V to about 200 V, a SF6 flow rate ranging from about 10 sccm to about 100 sccm, a CHxFy flow rate ranging from about 10 sccm to about 500 sccm, and an He flow rate ranging from about 10 sccm to about 1000 sccm.

Following the etching process, spacers 234 are formed on the sidewalls of the gate structures of the NMOS device 206. The spacers 234 include portions of the nitride layer 226 and oxide layer 224. In the present embodiment, the spacers 234 have a critical dimension of about 15 nm. Further, portions of the oxide layer 224 are exposed in the NMOS devices 206, 210 after the etching process.

Figure 5:
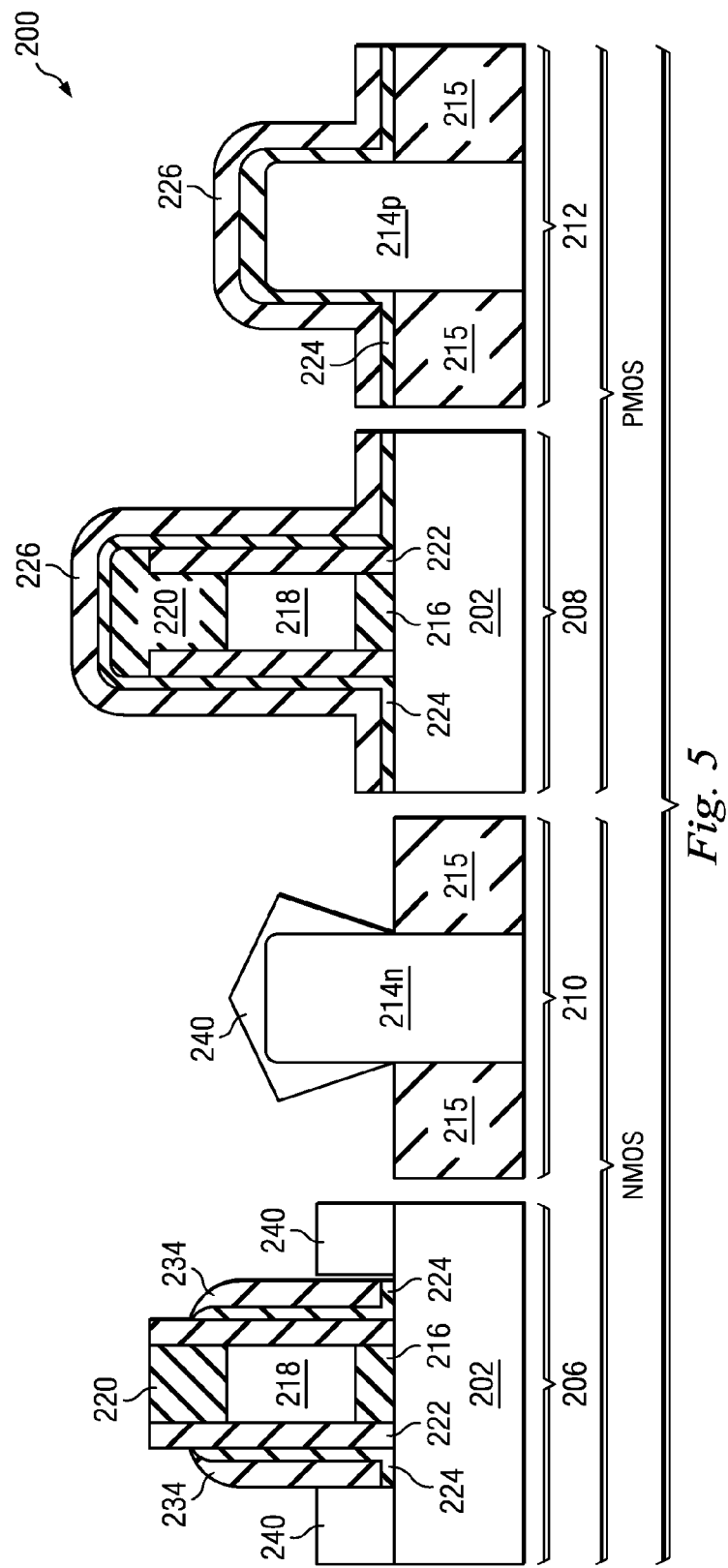

In FIG. 5, an etching process is performed to remove exposed portions of the oxide layer 224 in the NMOS devices 206, 210. The etching process includes a wet etching process, dry etching process, or combination dry and wet etching processes to remove portions of the silicon substrate 202 that are exposed. For example, the wet etching may include an HF dip to remove the exposed portions of the oxide layer 224 in the NMOS devices 206, 210. It is noted that the nitride layer 226 protects the oxide layer 226 overlying the PMOS devices 208, 212. An epitaxial (epi) process is performed to grow epi silicon on exposed portions of the silicon substrate to form raised source/drain features. The photoresist layer 230 and BARC layer 232 protecting the PMOS devices 208, 212 are removed prior to the epi process. It is understood that epi process is known in the art and thus not described in detail herein. In the present embodiment, epi silicon 240 is formed on source/drain regions of the NMOS device 206, and epi silicon 240 is formed on the fin 214n of the NMOS device 210. In some other embodiments, a trench may be formed in the substrate 202 at the source/drain regions and in the fin 214n, and silicon carbide (SiC) may be deposited in the trench to form strained features for exerting stress (e.g., tensile strain) on a channel region of the NMOS devices 208, 210.

Figure 6:
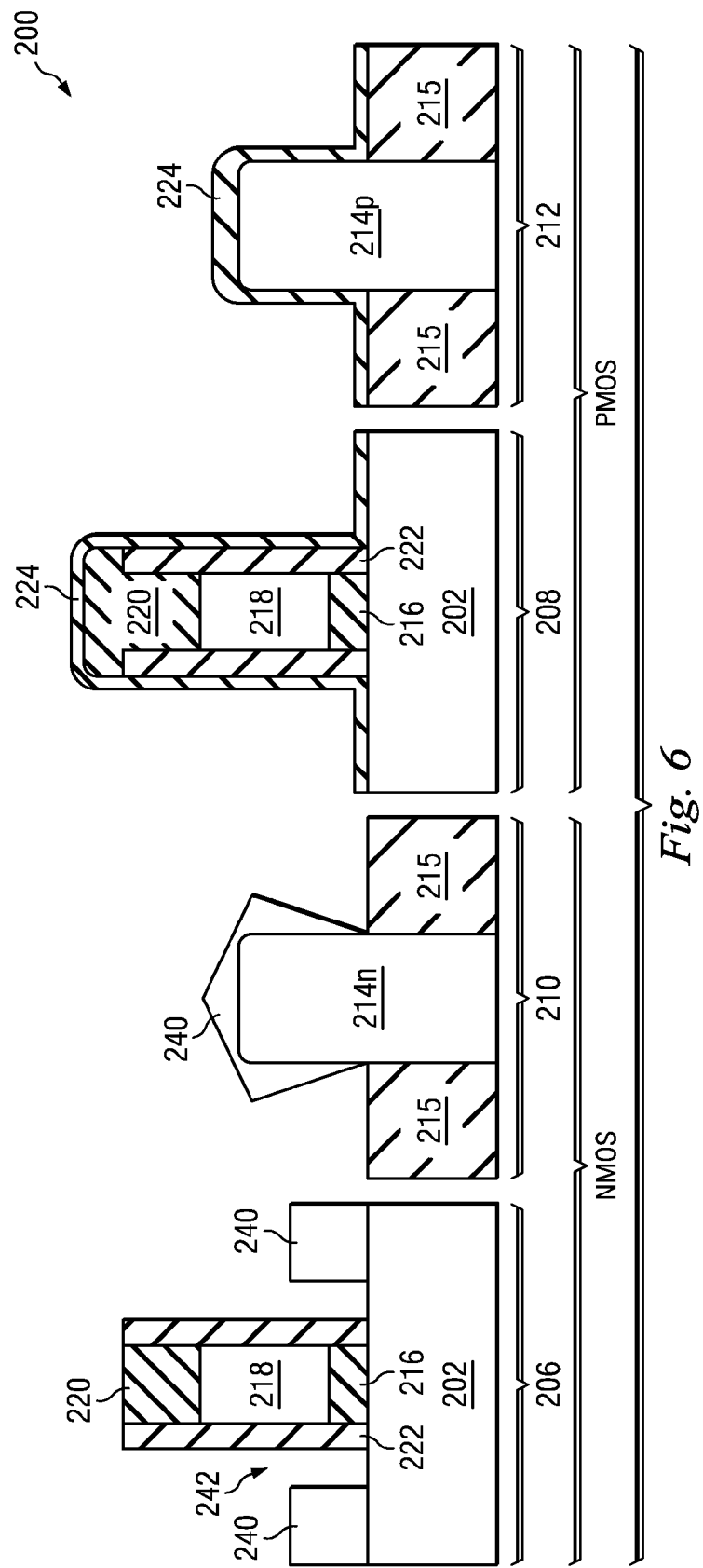

In FIG. 6, an etching process is performed to remove the nitride layer 226 overlying the PMOS devices 208, 212. The etching process includes a wet etching utilizing H3PO4 or other suitable etchant. The wet etching is selected so that a slow etch rate is achieved to protect the poly. It is noted that the wet etching also removes the nitride layer of the spacers 234 thereby forming a gap 242 between the sidewall of the gate structure and the epi silicon 240.

Figure 7:
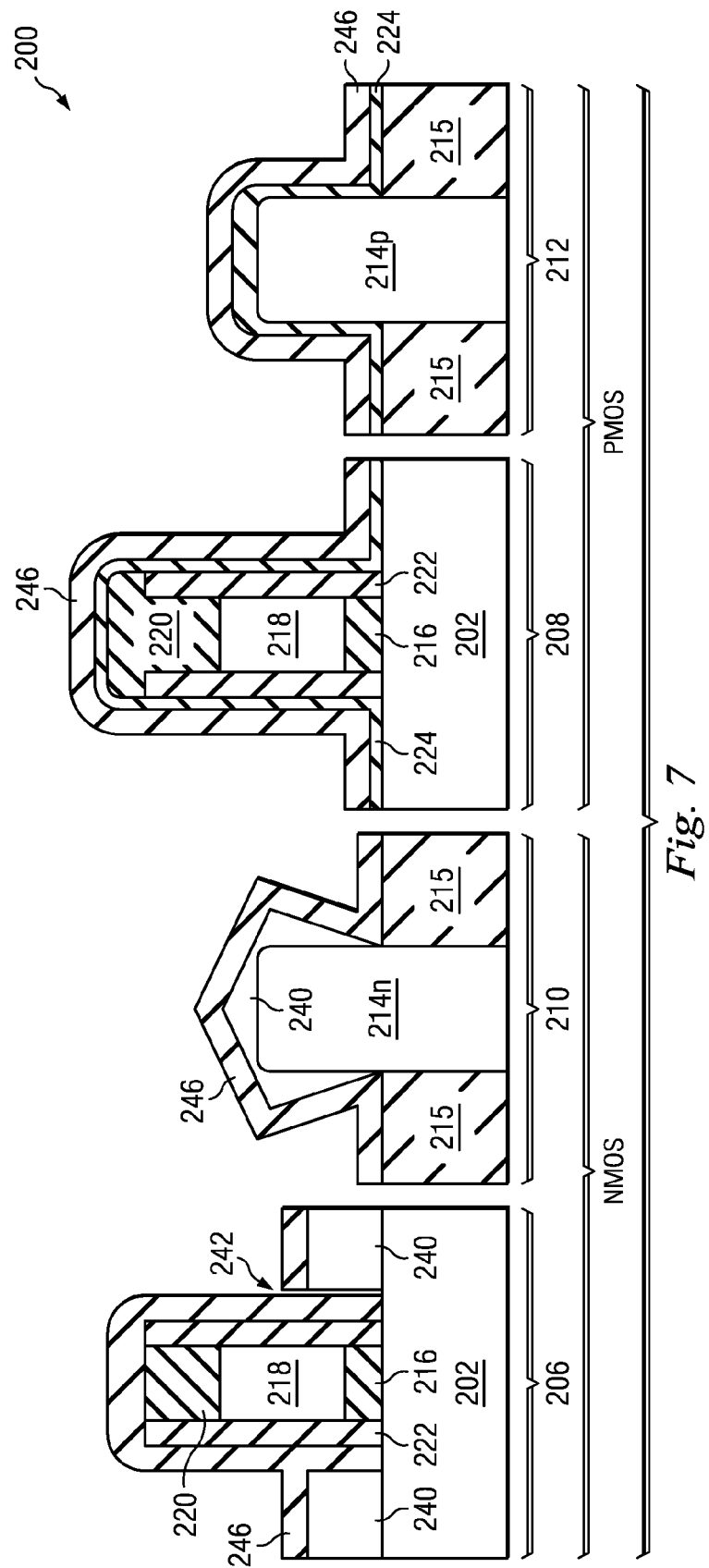

In FIG. 7, a capping layer such as a silicon nitride layer 246 is formed over the substrate 202. The nitride layer 246 may be formed by CVD, PVD, ALD, furnace-type processing, or other suitable technique. The silicon nitride layer 226 includes a thickness ranging from about 20 to about 30 nm. In the present embodiment, the nitride layer 226 has a thickness of about 25 nm. It has been observed that voids may form within the gap 242 between the sidewall of the gate structure and the epi silicon 240 after formation of the nitride layer 246 which can adversely affect subsequent processing. As such, the epi process may be tuned so that the epi silicon 240 can have a desired profile to minimize the risk of voids being formed between the gate structure and the epi silicon 240.

Figure 8:
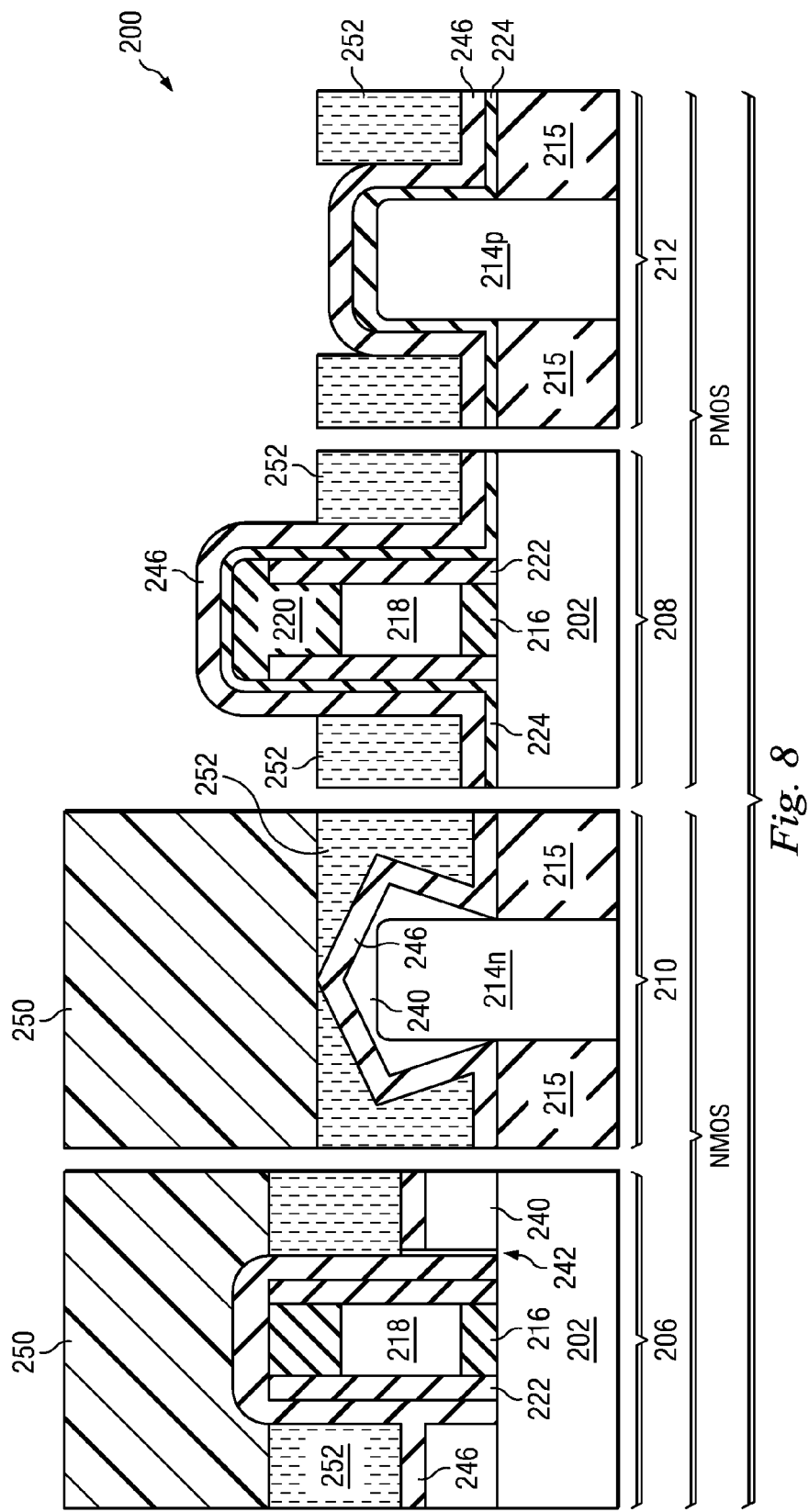

In FIG. 8, a patterned photoresist layer 250 is formed to protect the NMOS devices 206, 210. The patterned photoresist layer 250 may be formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper techniques such as maskless photolithography, electron-beam writing, ion-beam writing, and molecular imprint. In some embodiments, a bottom anti-reflective coating (BARC) layer 252 may be formed prior to forming the resist layer 250.

Figure 9:
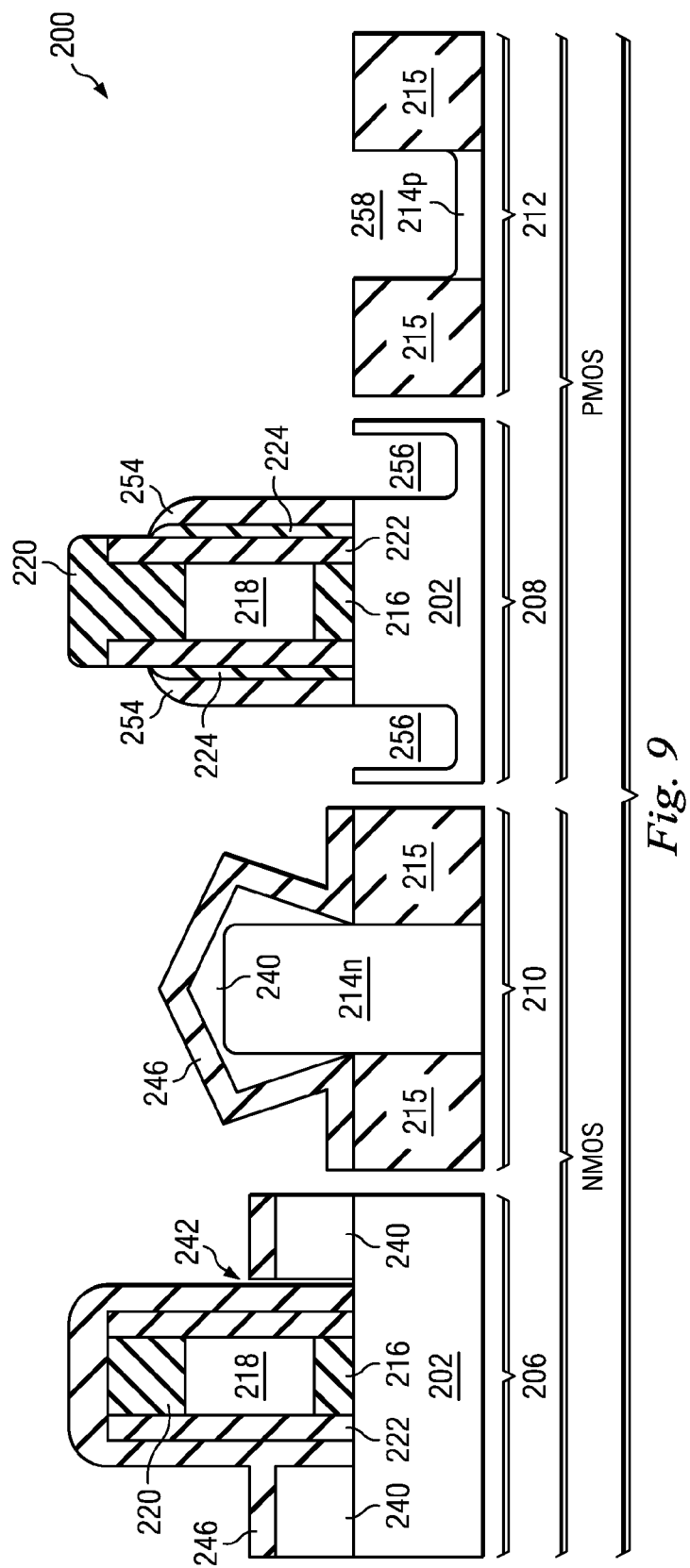

In FIG. 9, an etching process is performed to remove portions of the nitride layer 246 overlying the substrate 202 at either side of the gate structure of the PMOS devices 208, 212. It is noted that the nitride layer 246 over the fin 214p is completely removed due to the height difference between the gate structure and the fin. Further, the BARC layer 252 overlying the PMOS devices 208, 212 may be removed during the etching process. The etching process may be similar the one discussed above with reference to FIG. 4. The patterned photoresist layer 250 protects the nitride layer 246 overlying the NMOS devices 206, 210 during the etching process. Following the etching process, spacers 254 are formed on the sidewalls of the gate structures of the PMOS devices 208, 212. The spacers 254 include portions of the nitride layer 246 and oxide layer 224. In the present embodiment, the spacers 234 have a critical dimension of about 15 nm. Further, portions of the oxide layer 224 are exposed in the PMOS devices 208, 212 after the etching process. Those portions of the oxide layer 224 may be removed by an HF dip or other suitable etching process thereby exposing portions of the substrate 202 and fin 214p of the PMOS devices 208, 212.

Another etching process is performed to form a recess 256 in the substrate 202 of the PMOS device 208, and a recess 258 in the fin 214p of the PMOS device 212. The etching process may include dry etching, wet etching, or combination thereof. In the present embodiment, the etching process includes a dry etching process that utilizes a combination of HBr/Cl2/O2/He, a pressure ranging from about 1 mT to about 1000 mT, a power ranging from about 50 W to about 1000 W, a bias voltage ranging from about 100 V to about 500 V, an HBr flow rate ranging from about 10 sccm to about 500 sccm, a Cl2 flow rate ranging from about 0 sccm to about 500 sccm, an O2 flow rate ranging from about 0 sccm to about 100 sccm, and an He flow rate ranging from about 0 sccm to about 1000 sccm. The dry etching removes portions of the silicon substrate 202 and fin 214p that are unprotected or exposed. Accordingly, the recess 256 has vertical sidewalls that are aligned with the spacers 254 due to the directional/anisotropic etching. The recess 256, 258 may have a depth ranging from about 400 to about 800 Angstrom (Å). In some embodiments, a pre-cleaning process may be performed to clean the recess 256, 258 with HF or other suitable solution.

Figure 10:
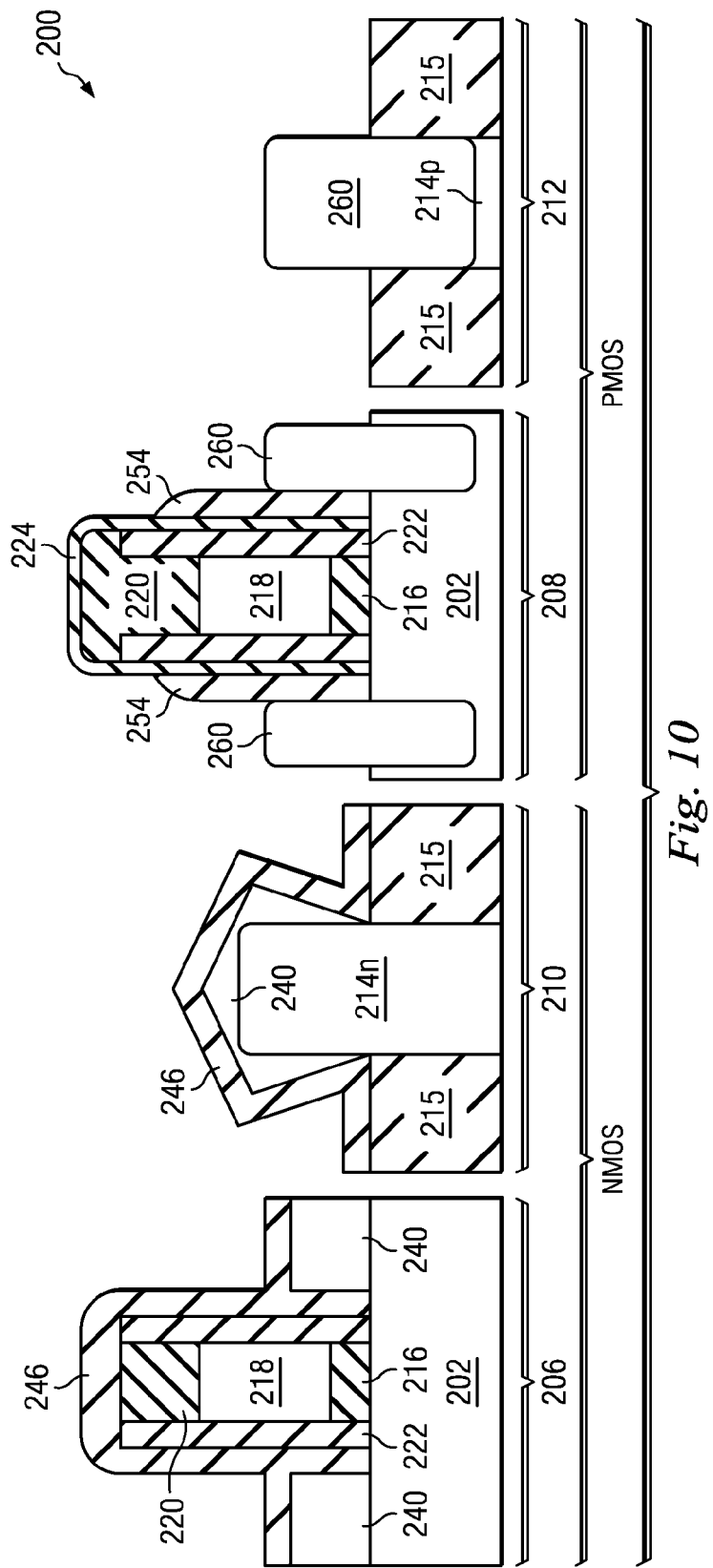

In FIG. 10, a semiconductor material is deposited in the recess 256, 258 to form strained structures of the PMOS devices 208, 212. In an embodiment, an epitaxial (epi) process is performed to deposit a semiconductor material in the recess 256, 258. The semiconductor material is different from the substrate 202. Accordingly, the channel region of the PMOS device 208, 212 is strained/stressed (e.g., compressive strain) to enable carrier mobility of the device and enhance device performance. The patterned photoresist 250 and BARC layer 252 protecting the NMOS devices 206, 210 are removed prior to the epi process. In the present embodiment, silicon germanium (SiGe) is deposited by an epi process in the recess 256, 258 of the substrate 202 and the fin 214p to form SiGe features 260 in a crystalline state. The SiGe epi process is known in the art, and thus not described in detail herein. It is noted that the nitride layer 246 protects the NMOS devices 206, 210 during the SiGe epi process. Additionally, the SiGe 260 is deposited such that it is raised above the surface of the substrate 202. In some embodiments, the SiGe 260 may be in-situ doped with p-type impurities, such as B or In, to form source/drain regions of the PMOS devices 208, 212.

Figure 11:
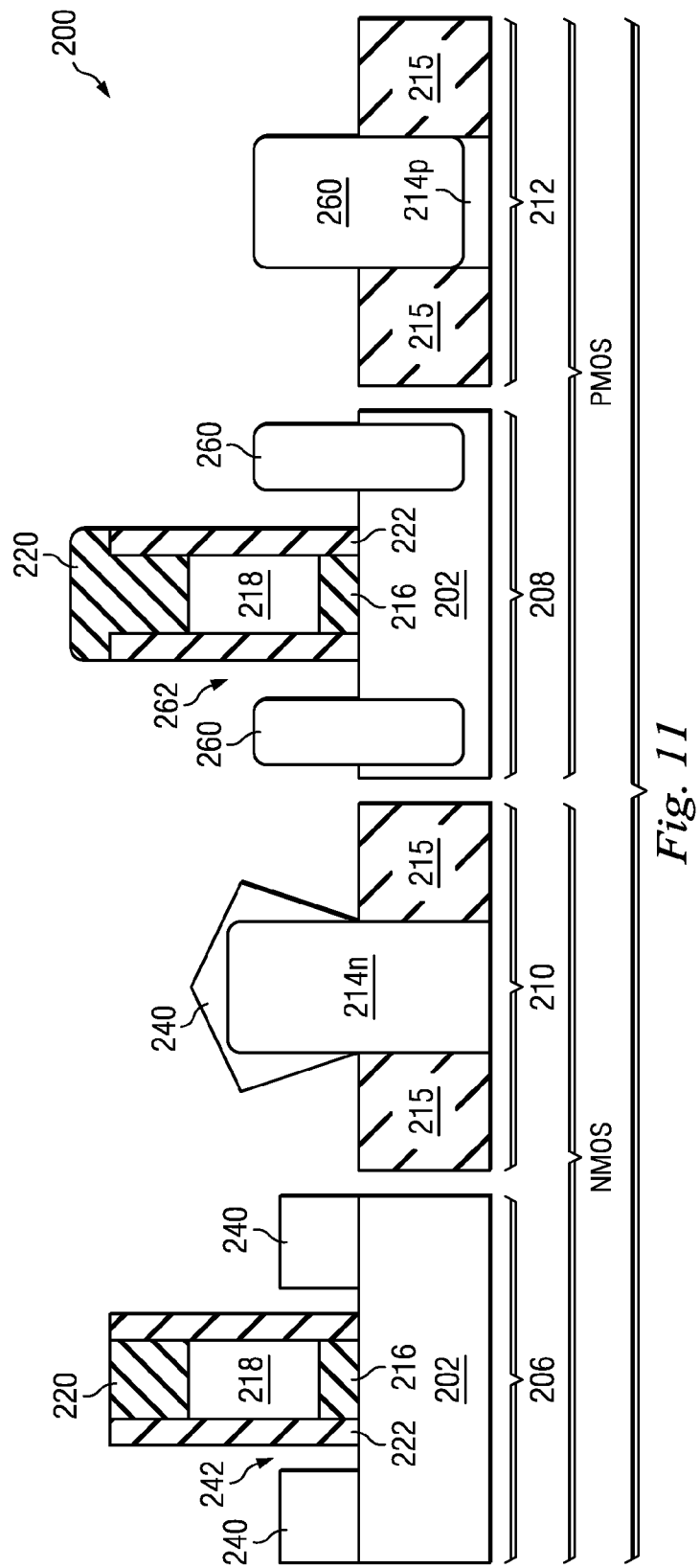

In FIG. 11, an etching process is performed to remove the nitride layer 246 overlying the NMOS devices 206, 210. The etching process includes a wet etching utilizing H3PO4 or other suitable etchant. The wet etching is selected so that a slow etch rate is achieved to protect the poly. As discussed above, the gap 242 between the sidewalls of the gate structure and the epi silicon 240 of the NMOS device 206 may induce voids being formed during subsequent processing. Further, it is noted that the wet etching also removes the nitride layer of the spacers 254 thereby forming a gap 262 between the sidewalls of the gate structure and the epi SiGe 260 of the PMOS device 208. As such, the gap 262 may also induce voids being formed during subsequent processing similar to the gap 242 in the NMOS device 206. The discussion that follows illustrates another embodiment of a dual epitaxial (epi) process that minimizes the risk of voids being formed between the gate structure and the strained source/drain features.

The semiconductor device 200 continues with processing to complete fabrication as discussed briefly below. For example, source/drain regions for the NMOS devices 206, 210 may be formed by ion implantation of n-type dopants such as P or As, and source/drain regions for the PMOS devices 208, 212 may be formed by ion implantation of p-type dopants such as B. Additionally, silicide features are formed on the raised source/drain regions to reduce the contact resistance. The silicide can be formed on the source and drain regions by a process including depositing a metal layer, annealing the metal layer such that the metal layer is able to react with silicon to form silicide, and then removing the non-reacted metal layer.

An inter-level dielectric (ILD) layer is formed on the substrate and a chemical mechanical polishing (CMP) process is further applied to the substrate to planarize the substrate. Further, an contact etch stop layer (CESL) may be formed on top of the gate structures before forming the ILD layer. In an embodiment, the gate electrode 208 remains poly in the final device. In another embodiment, the poly is removed and replaced with a metal in a gate last or gate replacement process. In a gate last process, the CMP process on the ILD layer is continued to expose the poly of the gate structures, and an etching process is performed to remove the poly thereby forming trenches. The trenches are filled with a proper work function metal (e.g., p-type work function metal and n-type work function metal) for the PMOS devices and the NMOS devices.

A multilayer interconnection (MLI) including metal layers and inter-metal dielectric (IMD) is formed on the substrate to electrically connect various device features to form a integrated circuit. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper multi-layer interconnection structure.

Figure 12A:
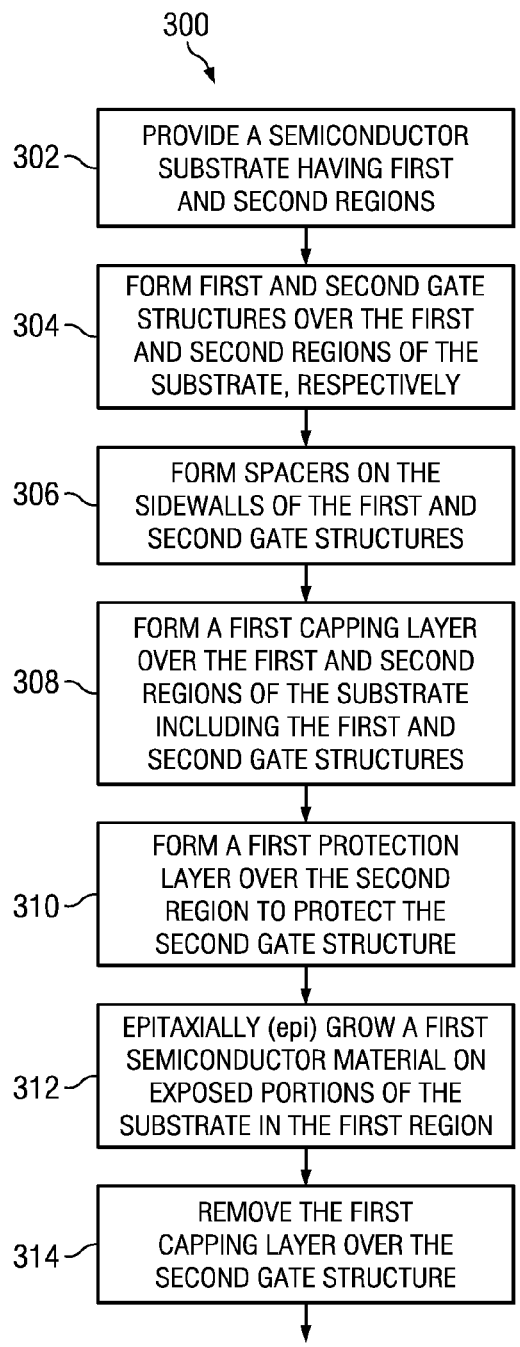
FIGS. 12A-12B illustrate a flow chart of another method of fabricating a semiconductor device with a dual epi process according to various aspects of the present disclosure.
Figure 12B:
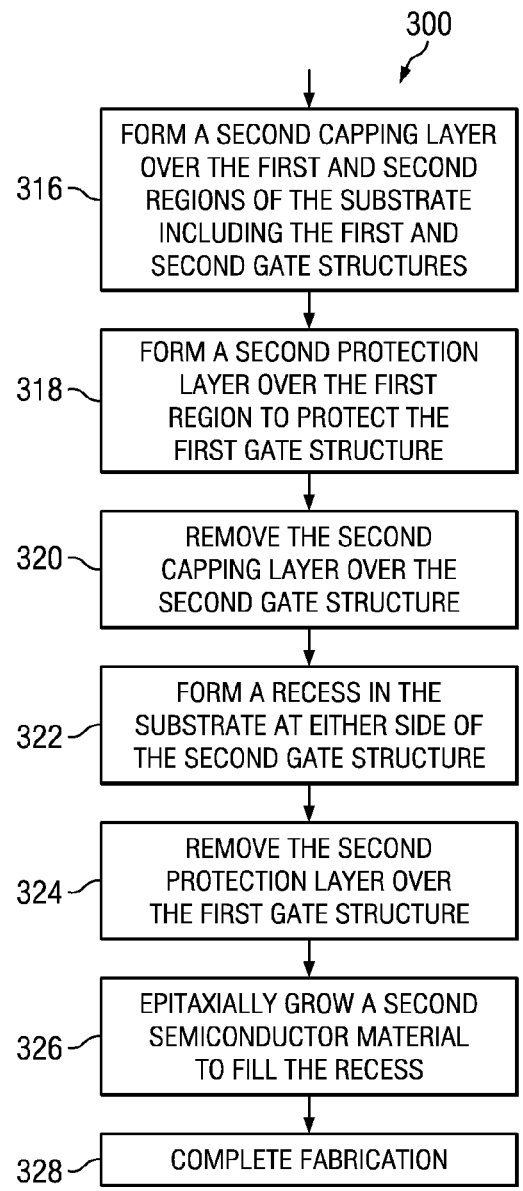

Referring to FIGS. 12A-12B, illustrated is a flowchart of a method 300 of fabricating a semiconductor device with a dual epitaxial (epi) process according to various aspects of the present disclosure. The method 300 begins with block 302 in which a semiconductor substrate having first and second regions is provided. The method 300 continues with block 304 in which first and second gate structures are formed over the first and second regions of substrate, respectively. The method 300 continues with block 306 in which spacers are formed on the sidewalls of the first and second gate structures. The method 300 continues with block 308 in which a first capping layer is formed over the first and second regions of the substrate including the first and second gate structures. The method 300 continues with block 310 in which a first protection layer is formed over the second region to protect the second gate structure. The method 300 continues with block 312 in which a first semiconductor material is epitaxially grown on exposed portions of the substrate in the first region. The method 300 continues with block 314 in which the first capping layer over the second gate structure is removed.

The method 300 continues with block 316 in which a second capping layer is formed over the first and second regions of the substrate including the first and second gate structures. The method 300 continues with block 318 in which a second protection layer is formed over the first region to protect the first gate structure. The method 300 continues with block 320 in which the second capping layer over the second gate structure is removed. The method 300 continues with block 322 in which a recess is formed in the substrate at either side of the second gate structure. The method 300 continues with block 324 in which the second protection layer over the first gate structure is removed. The method 300 continues with block 326 in which a second semiconductor material is epitaxially grown to fill the recess. The method 300 continues with block 328 in which fabrication of the semiconductor device is completed. The discussion that follows illustrates various embodiment of a semiconductor device that can be fabricated according to the method 300 of FIGS. 12A-12B.

Figure 13:
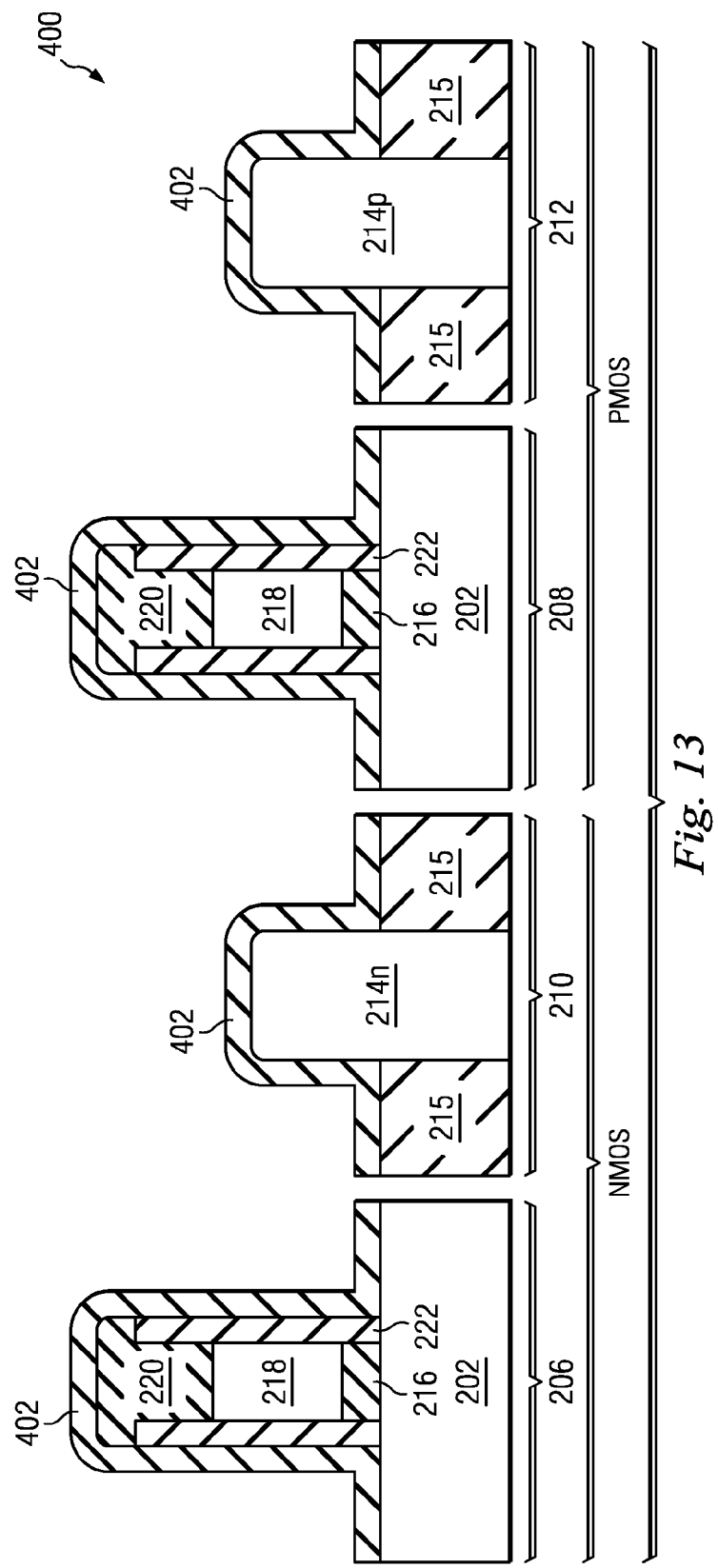
FIGS. 13-24 illustrate cross-sectional views of a semiconductor device at various stages of fabrication according to the method of FIGS. 12A-12B.

Referring to FIGS. 13-24, illustrated are cross-sectional views of a semiconductor device 400 at various stages of fabrication according to the method 300 of FIGS. 12A-12B. It should be noted that the semiconductor device 400 may be fabricated by CMOS technology. Accordingly, additional processes may be provided before, during, and after the method 300 of FIGS. 12A-12B, and that some process are only briefly described herein. Further, the semiconductor device 400 is similar to the semiconductor device 200 of FIGS. 2-11, and thus similar features are numbered the same for the sake of clarity and simplicity. In FIG. 13, the semiconductor device 400 includes a substrate 202. The substrate 202 includes a silicon substrate. In another embodiment, the semiconductor substrate 202 may include an epitaxial layer. For example, the substrate 202 may have an epitaxial layer overlying a bulk semiconductor. The substrate 202 further includes doped regions such as p-wells and n-wells.

Various shallow trench isolation (STI) structures are formed in the semiconductor substrate for isolating the various active regions. The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

One or more operational devices are formed in the active regions. The operational devices include n-type and p-type metal-oxide-semiconductor devices (NMOS and PMOS). The NMOS and PMOS devices may be fabricated by CMOS technology processing. The NMOS and PMOS devices may include planar field-effect transistor (FET) devices 206, 208 and non-planar transistor devices such as FinFET devices 210, 212. It is understood that both types of transistors are illustrated for the sake of example, and that the FinFET devices 210, 212 are shown across a fin structure whereas the FET devices 206, 208 are shown across a gate structure. The FinFET devices 210, 212 include fins 214n, 214p that extend from the substrate 202. Although only one fin is shown for the NMOS and PMOS devices 210, 212, it is understood that the number of fins may vary depending on the particular application.

In the present embodiment, each NMOS and PMOS devices includes a gate structure formed on the semiconductor substrate 202. It is understood that the FinFET devices 210, 212 may include more than one gate structure in multi-gate configurations. Although not shown, the gate structures wrap around the fins 214n, 214p allowing gate control of the channel from both sides of the fin. The gate structure includes a gate dielectric 216 and a gate electrode 218. The gate structure may further include a hard mask layer 220 formed on the gate electrode 218.

The semiconductor device 400 includes a sealing layer 222 formed on each sidewall of the gate structures. The sealing layer 222 includes silicon nitride and has a thickness ranging from about 5 to about 8 nm. In the present embodiment, the sealing layer 222 has a thickness of about 7 nm. The sealing layer 222 may be formed by CVD, PVD, ALD, plasma enhanced CVD (PECVD), or other suitable technique. In some embodiments, an ion implantation process may be performed to form lightly doped source/drain regions (LDD) in the substrate 202. The LDD regions (not shown) are aligned with the sidewall of the gate structure. The ion implantation process may utilize p-type dopants (e.g., B or In) for the PMOS devices and n-type dopants (P or As) for the NMOS devices.

A spacer-material layer such as a silicon nitride layer 402 is formed over the substrate 202 including over the gate structures and fins 214n, 214p. The silicon nitride layer 402 may be formed by CVD, PVD, ALD, or other suitable technique. In the present embodiment, the silicon nitride layer 402 includes a thickness ranging from about 4 nm to about 6 nm. In an embodiment, the silicon nitride layer 402 has a thickness of about 5 nm. Further, the silicon nitride layer 402 is doped with carbon so that an etching rate is different from undoped silicon nitride as will be explained in detail below.

Figure 14:
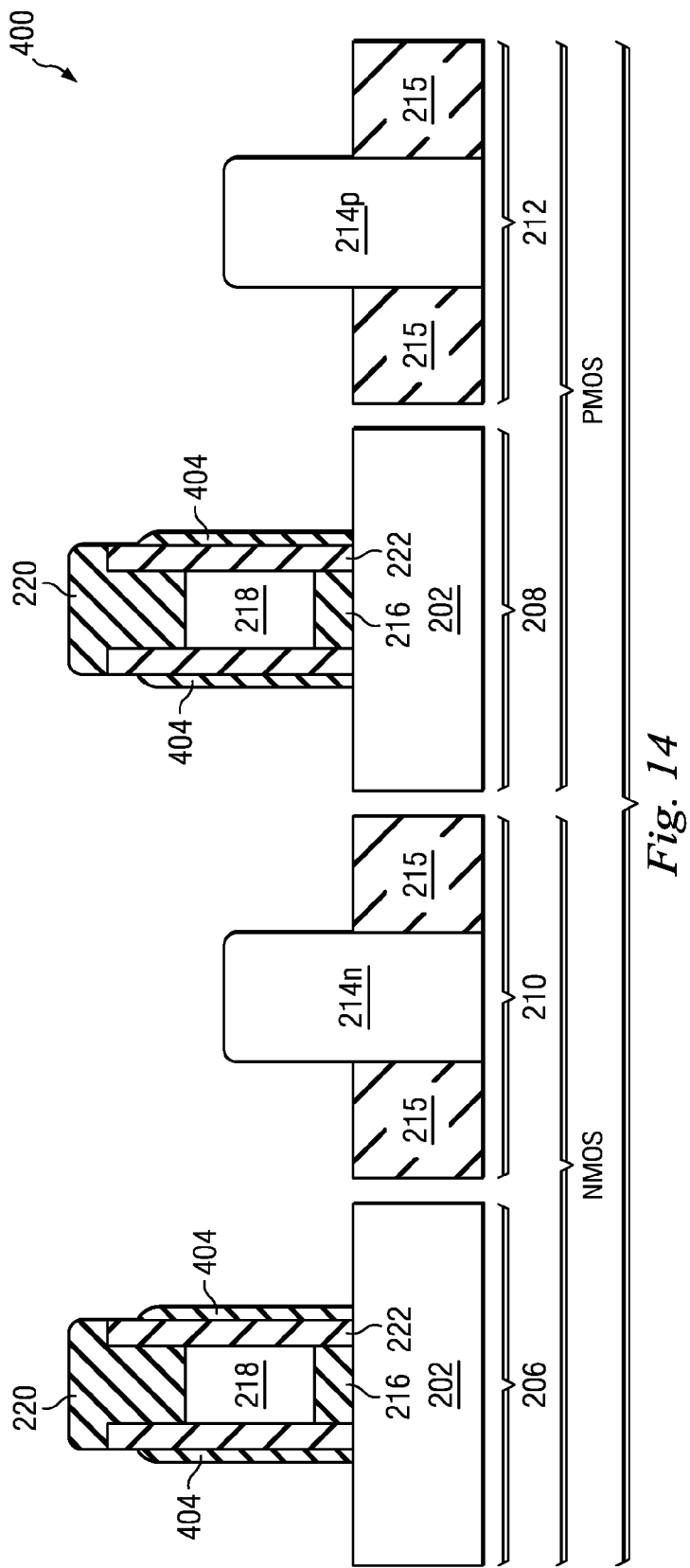

In FIG. 14, an etching process is performed on the silicon nitride layer 402 to form spacers 404. It is noted that the silicon nitride layer 402 overlying the fins 214n, 214p is completely removed due to the height difference between the gate structures and the fins. Following the etching process, the spacers 404 are disposed on the sidewalls of the gate structures of the NMOS device 206 and PMOS device 208. The combined thickness of the sealing layer 222 and the spacer 404 is about 12 nm.

Figure 15:
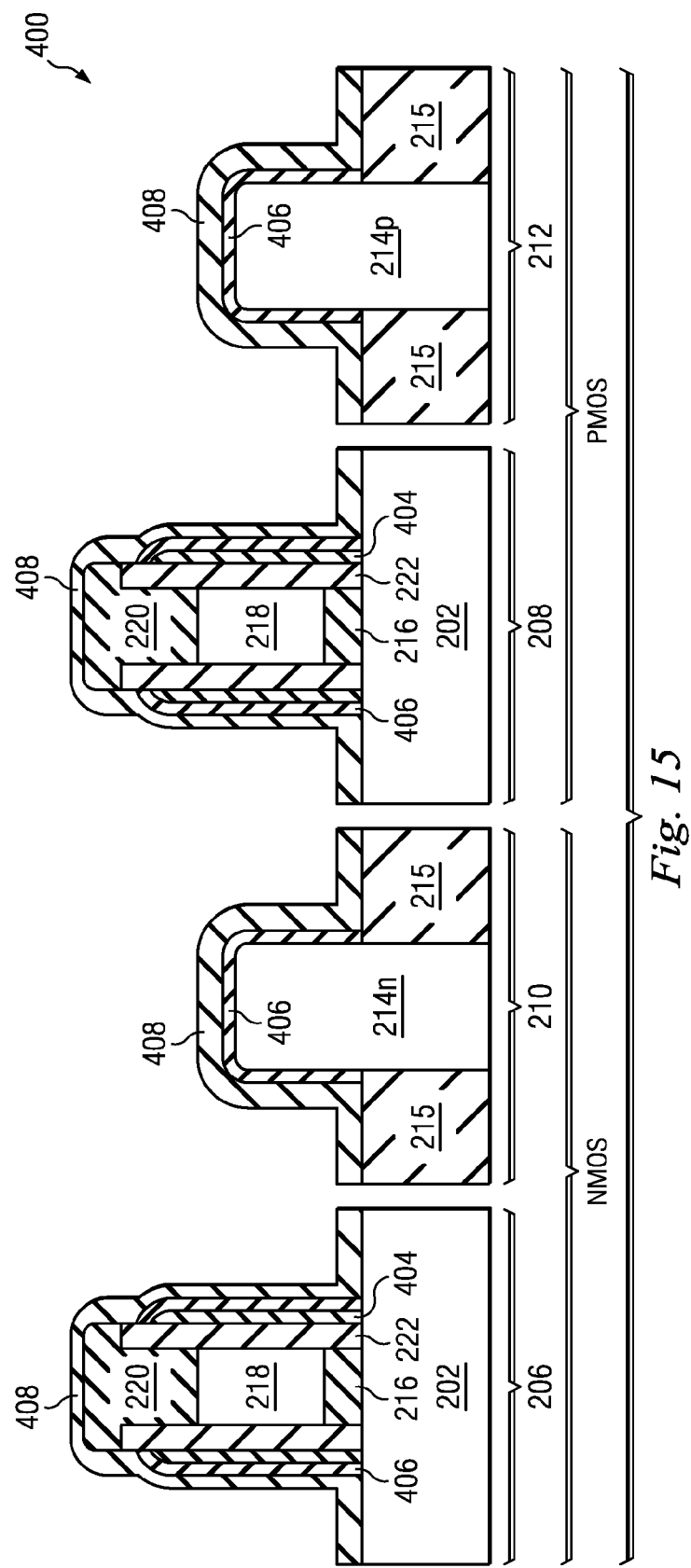

In FIG. 15, a capping layer such as an oxide layer 406 is formed over the substrate 202 including over the gate structures and fins 214n, 214p. The oxide layer 406 may be formed by CVD, PVD, ALD, or other suitable technique. The oxide layer 406 includes a thickness ranging from about 3 nm to about 5 nm. In the present embodiment, the oxide layer 406 has a thickness of about 4 nm. Another capping layer such as a silicon nitride layer 408 is formed over the oxide layer 406. The silicon nitride layer 408 may be formed by CVD, PVD, ALD, furnace-type processing, or other suitable technique. The silicon nitride layer 408 includes a thickness ranging from about 4 to about 6 nm. In the present embodiment, the silicon nitride layer 408 has a thickness of about 5 nm. Further, the silicon nitride layer 408 is not doped with carbon as compared to the doped silicon nitride of the spacers 404.

Figure 16:
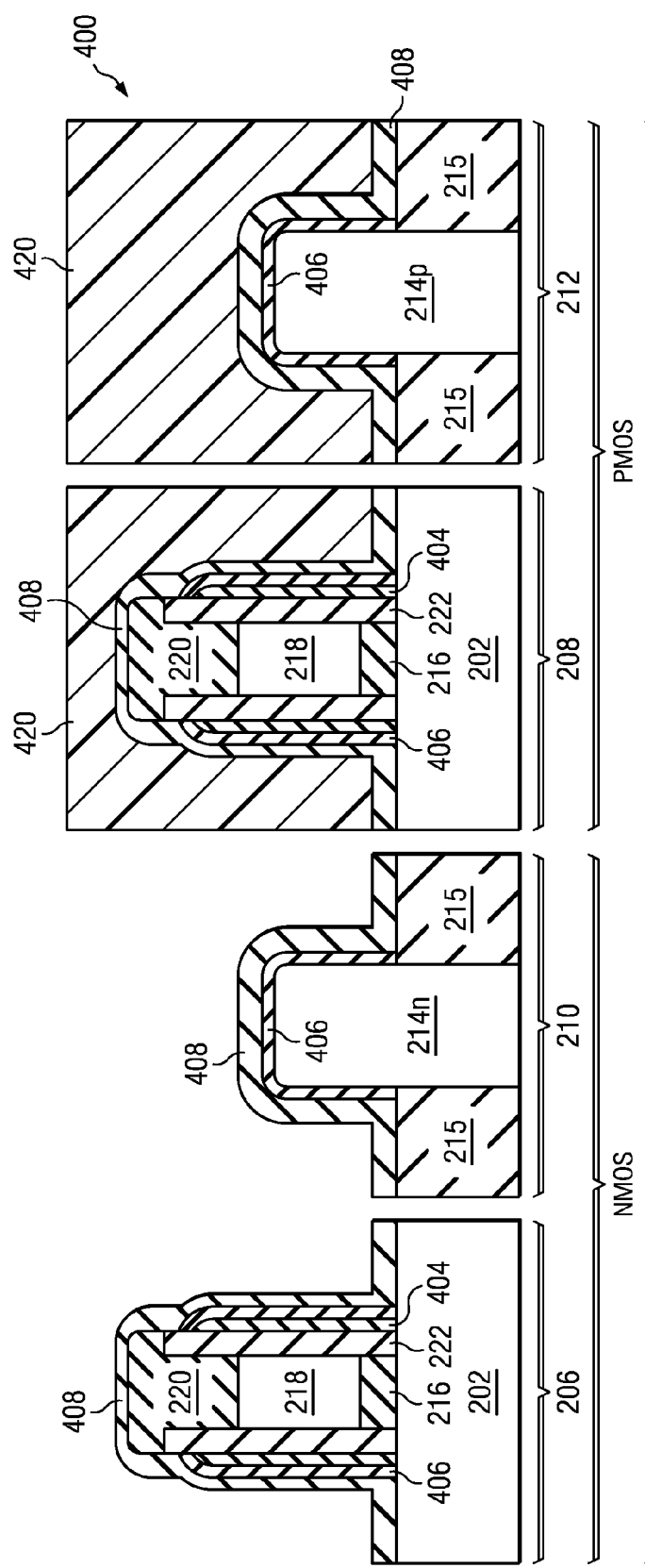

In FIG. 16, a patterned photoresist layer 420 is formed to protect the PMOS devices 208, 212. The patterned photoresist layer 420 may be formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper techniques such as maskless photolithography, electron-beam writing, ion-beam writing, and molecular imprint. In some embodiments, a bottom anti-reflective coating (BARC) layer may be formed prior to forming the resist layer 420.

Figure 17:
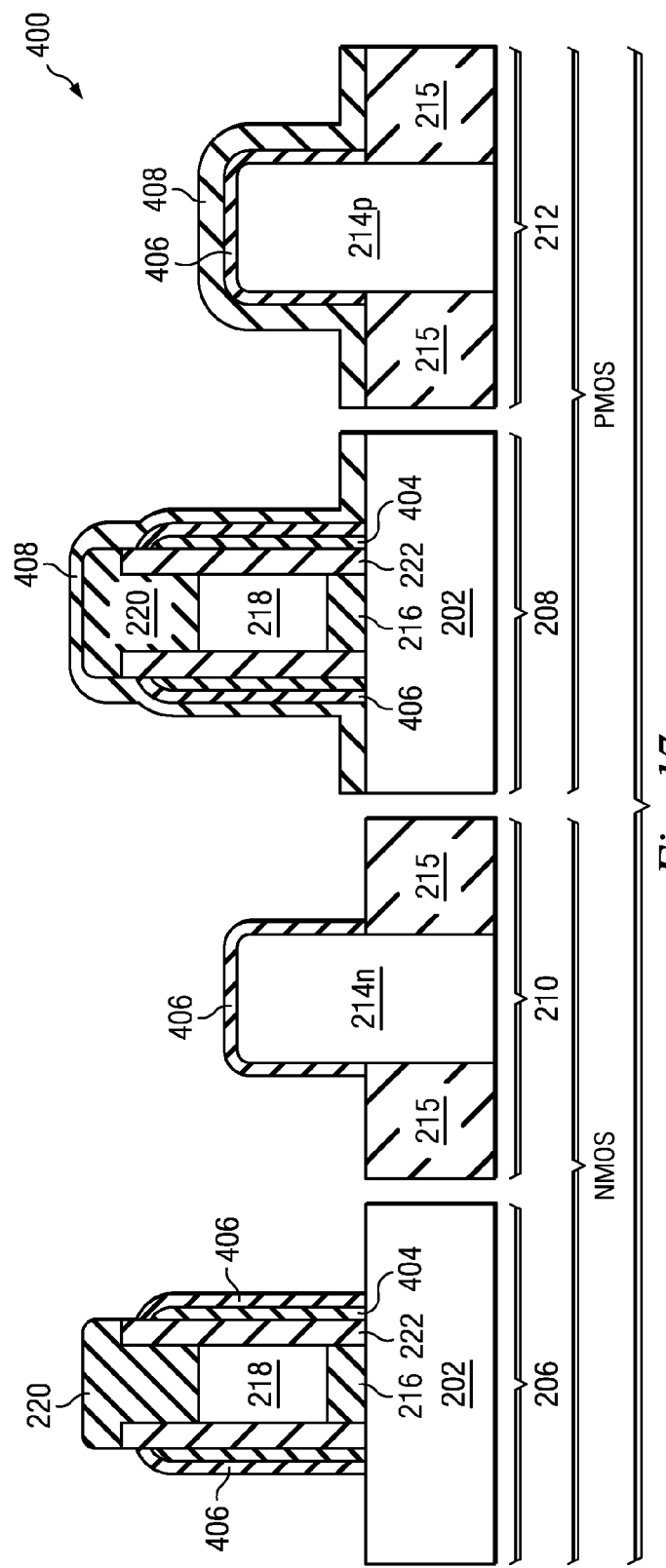

In FIG. 17, an etching process is performed to remove the nitride layer 408 overlying the NMOS devices 206, 210. The patterned photoresist layer 420 protects the silicon nitride layer 408 overlying the PMOS devices 208, 212 during the etching process. In the present embodiment, the etching process includes a dry etching process, wet etching process, or combination thereof. The etching process may stop at the oxide layer 404 overlying the NMOS devices 206, 210. An etching process is performed to remove the oxide layer 406 overlying the NMOS devices 206, 210. The etching process includes a wet etching process, dry etching process, or combination thereof to remove portions. For example, the wet etching may include an HF dip to remove the oxide layer 406 overlying the NMOS devices 206, 210. It is noted that the silicon nitride layer 408 protects the PMOS devices 208, 212 during the wet etching. The patterned photoresist 420 is removed following the etching process thereby exposing portions of the substrate 202 and the fin 214n of the NMOS devices 206, 210.

Figure 18:
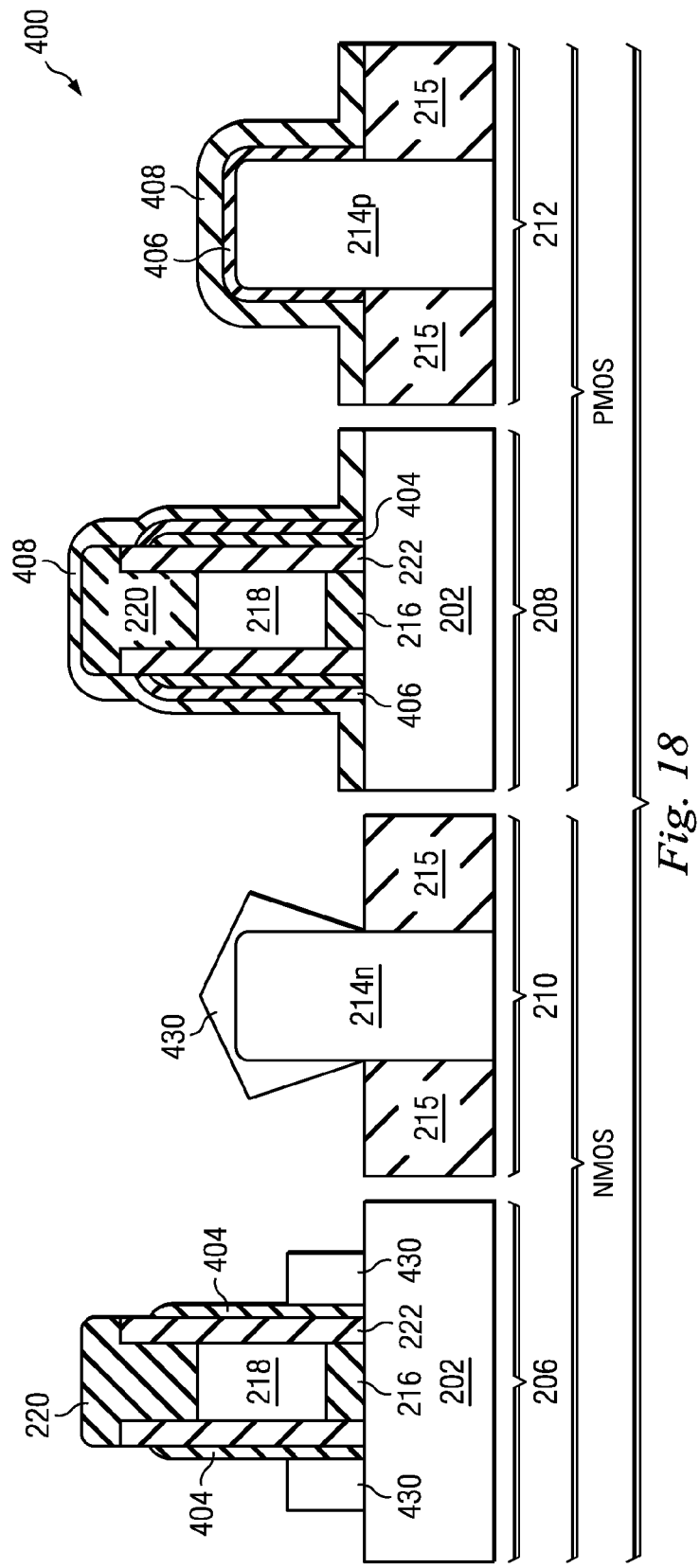

In FIG. 18, an epitaxial (epi) process is performed to grow epi silicon on exposed portions of the silicon substrate and silicon fin 214n. It is understood that epitaxial process is known in the art and thus not described in detail herein. In the present embodiment, epi silicon 430 is formed on source/drain regions of the NMOS device 206, and epi silicon 430 is formed on the fin 214n of the NMOS device 210. Further, it is noted that the epi silicon 430 is formed adjacent the spacers 404 in the NMOS device 206.

Figure 19:
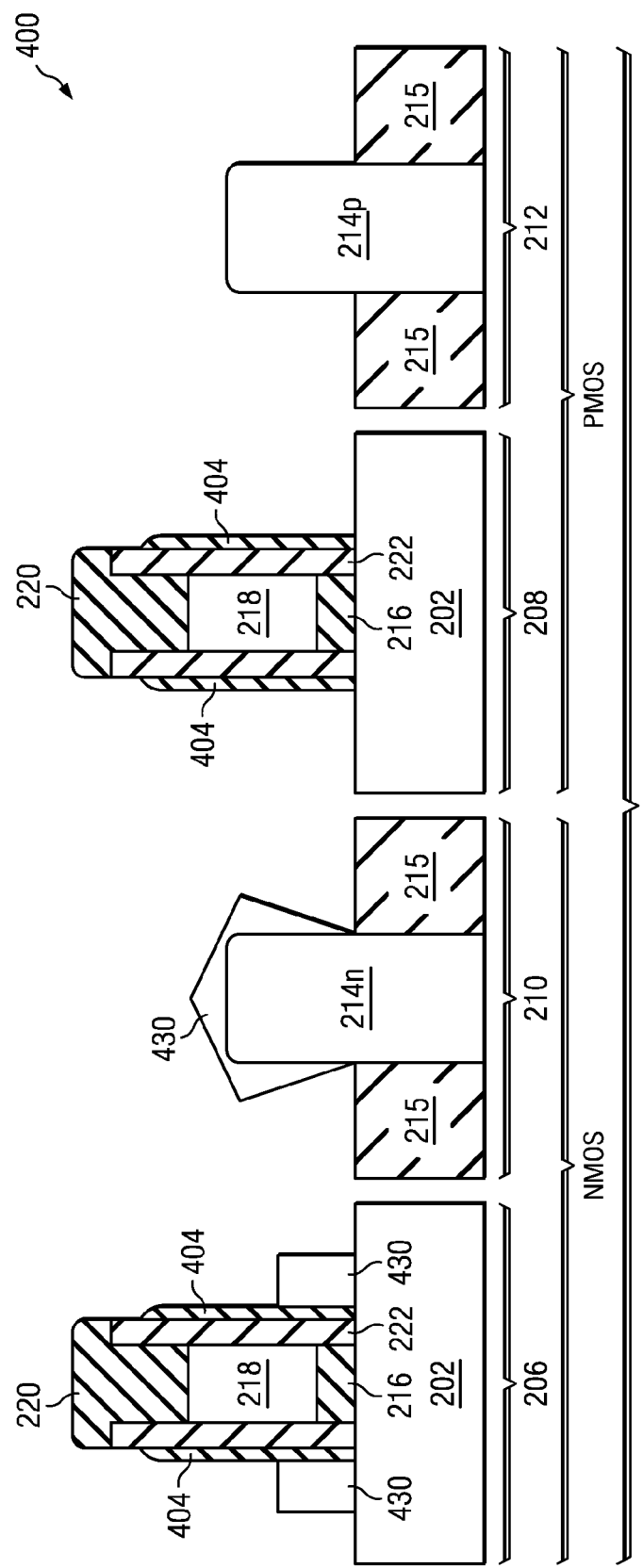

In FIG. 19, an etching process is performed to remove the nitride layer 408 overlying the PMOS devices 208, 212. The etching process includes a dry etching process, wet etching process, or combination thereof. The etching process may stop at the oxide layer 404 overlying the PMOS devices 208, 212. It is noted that the spacers 404 on the gate structure of the NMOS device 206 are not removed due to high etching selectivity between the doped silicon nitride and undoped silicon nitride. As such, no gap is formed between the gate structure and the epi silicon 430, and thus the risk of voids being formed in subsequent processing is minimized. An etching process is performed to remove the oxide layer 406 overlying the PMOS devices 208, 212. The etching process includes a wet etching process, dry etching process, or combination thereof to remove portions. For example, the wet etching may include an HF dip to remove the oxide layer 406 overlying the PMOS devices 208, 212.

Figure 20:
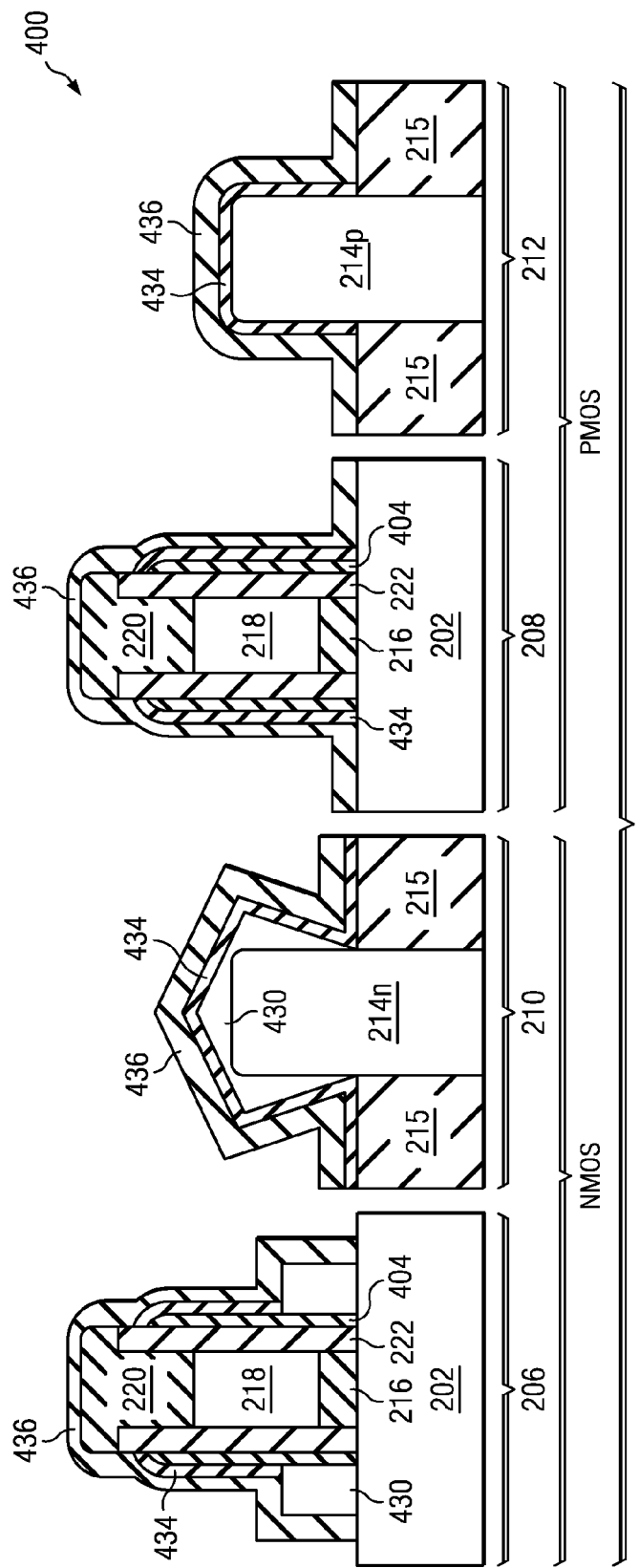

In FIG. 20, a capping layer such as an oxide layer 434 is formed over the substrate 202 including over the gate structures, fins 214n, 214p, and the epi silicon 430. The oxide layer 434 may be formed by CVD, PVD, ALD, or other suitable technique. The oxide layer 434 includes a thickness ranging from about 3 nm to about 5 nm. In the present embodiment, the oxide layer 434 has a thickness of about 4 nm. Another capping layer such as a silicon nitride layer 436 is formed over the oxide layer 434. The silicon nitride layer 436 may be formed by CVD, PVD, ALD, furnace-type processing, or other suitable technique. The silicon nitride layer 436 includes a thickness ranging from about 4 to about 6 nm. In the present embodiment, the silicon nitride layer 436 has a thickness of about 5 nm. Further, the silicon nitride layer 436 is not doped with carbon as compared to the silicon nitride of the spacers 404.

Figure 21:
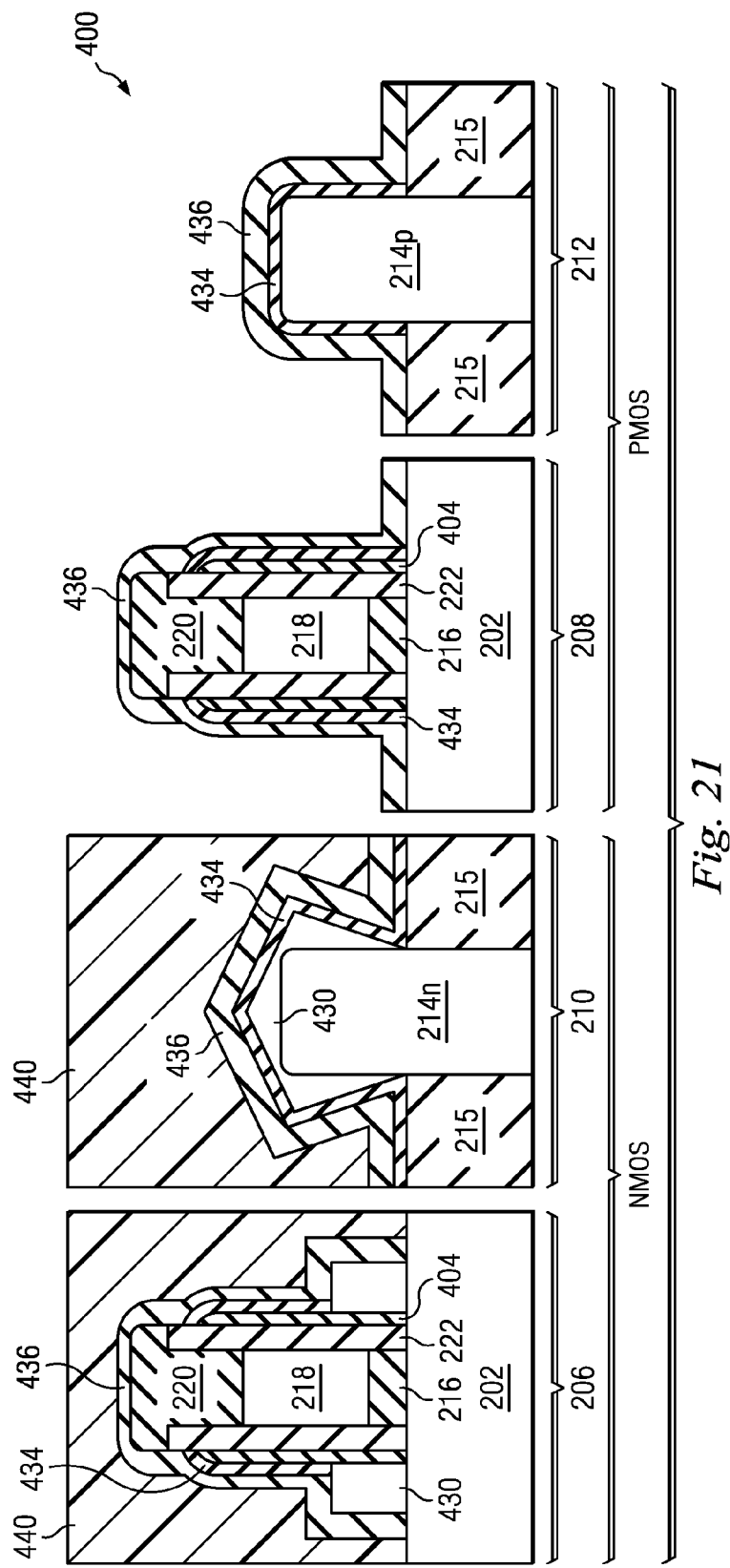

In FIG. 21, a patterned photoresist layer 440 is formed to protect the NMOS devices 206, 210. The patterned photoresist layer 440 may be formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper techniques such as maskless photolithography, electron-beam writing, ion-beam writing, and molecular imprint. In some embodiments, a bottom anti-reflective coating (BARC) layer may be formed prior to forming the resist layer 440.

Figure 22:
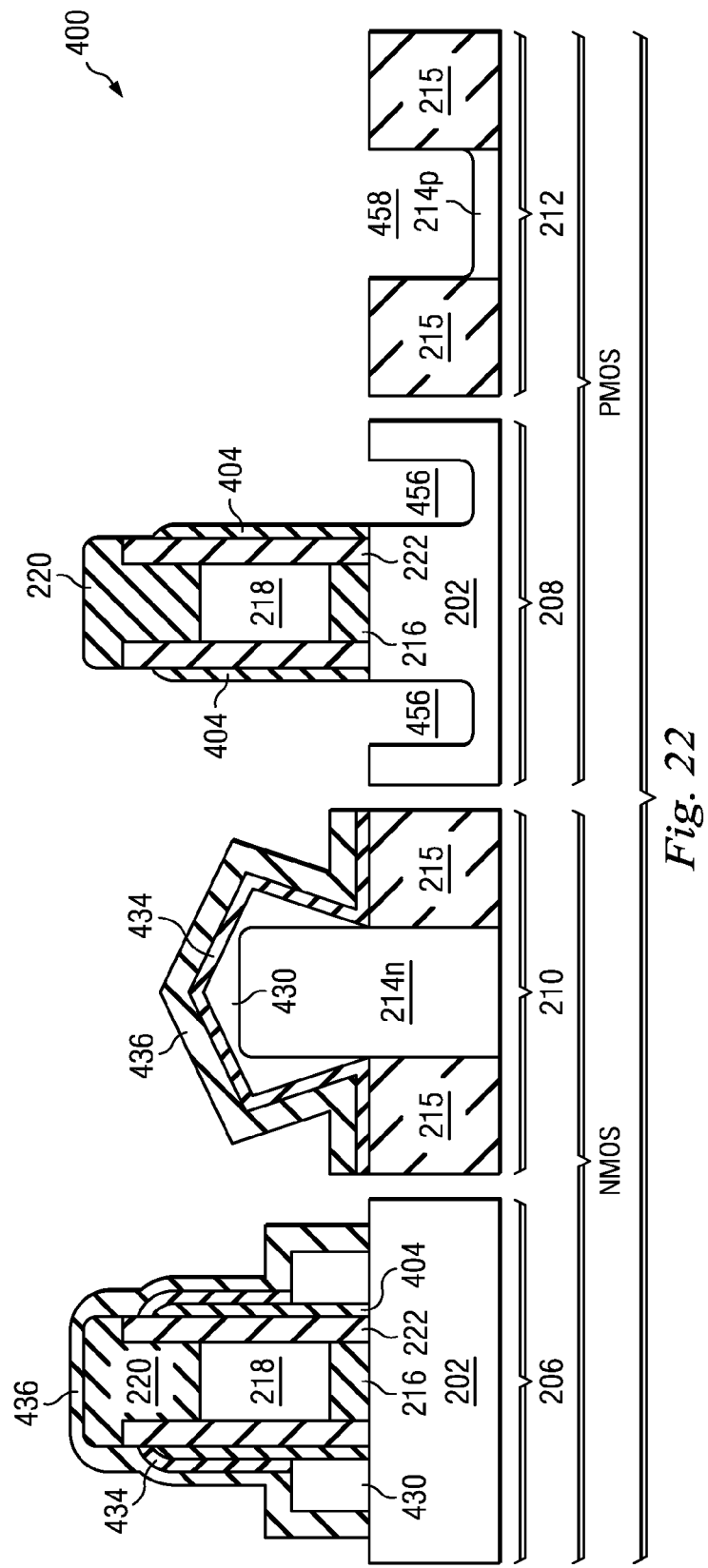

In FIG. 22, an etching process is performed to remove the nitride layer 436 overlying the PMOS devices 208, 212. The etching process includes a dry etching process, wet etching process, or combination thereof. The etching process may stop at the oxide layer 434 overlying the PMOS devices 208, 212. Another etching process is performed to remove the oxide layer 434 overlying the PMOS devices 208, 212. The etching process includes a wet etching process, dry etching process, or combination thereof to remove portions. For example, a wet etching may include an HF dip to remove the oxide layer 434 overlying the PMOS devices 208, 212. The patterned photoresist layer 440 protects the silicon nitride layer 436 overlying the NMOS devices 206, 210 during the etching processes.

An etching process is performed to form a recess 456 in the substrate 202 of the PMOS device 208, and a recess 458 in the fin 214p of the PMOS device 212. The etching process may include a dry etching, wet etching, or combination thereof. In the present embodiment, the etching process includes a dry etching process that utilizes a combination of HBr/Cl2/O2/He, a pressure ranging from about 1 mT to about 1000 mT, a power ranging from about 50 W to about 1000 W, a bias voltage ranging from about 100 V to about 500 V, an HBr flow rate ranging from about 10 sccm to about 500 sccm, a Cl2 flow rate ranging from about 0 sccm to about 500 sccm, an O2 flow rate ranging from about 0 sccm to about 100 sccm, and an He flow rate ranging from about 0 sccm to about 1000 sccm. The dry etching removes portions of the silicon substrate 202 and fin 214p that are unprotected or exposed. Accordingly, the recess 456 has vertical sidewalls that are aligned with the spacers 404 due to the directional/anisotropic etching. The recess 456, 458 may have a depth ranging from about 400 to about 800 Angstrom (Å). In some embodiments, a pre-cleaning process may be performed to clean the recess 456, 458 with HF or other suitable solution.

Figure 23:
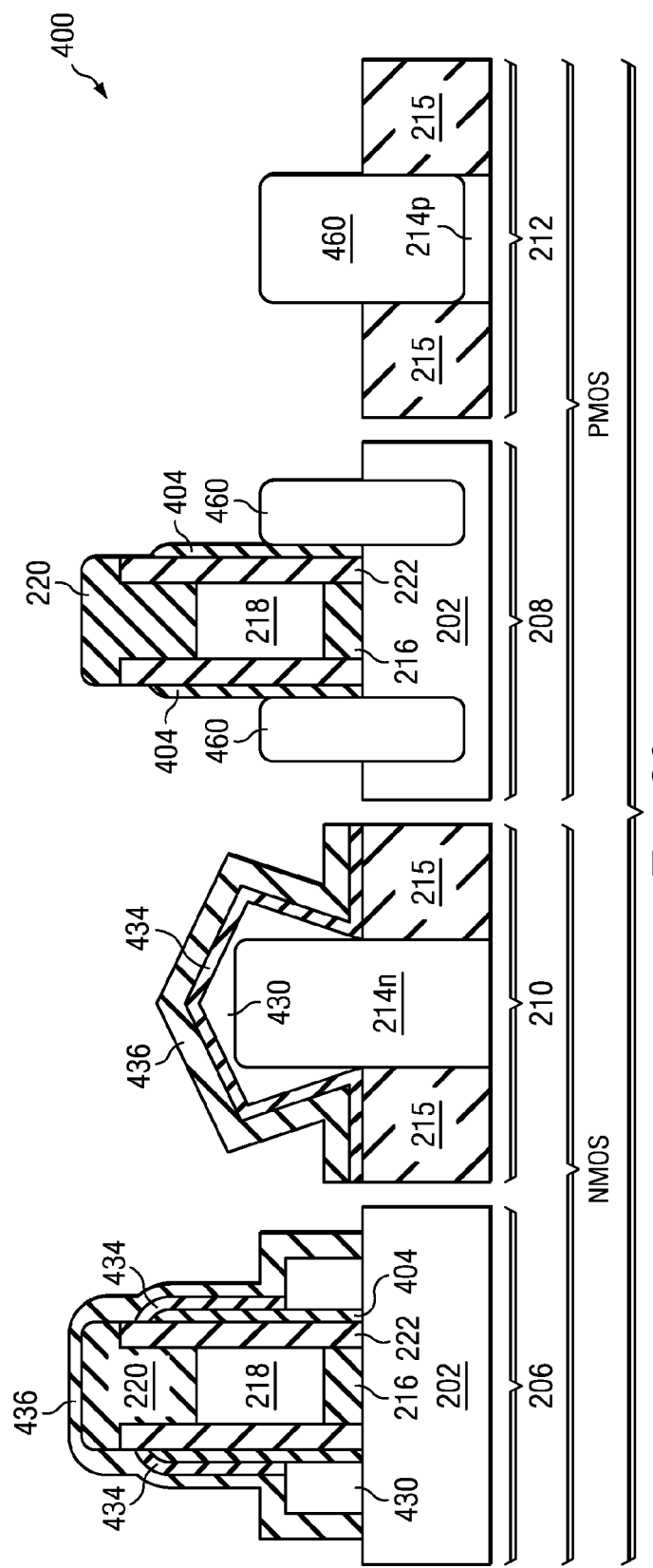

In FIG. 23, a semiconductor material is deposited in the recess 456, 458 to form strained structures of the PMOS devices 208, 212. In an embodiment, an epitaxial (epi) process is performed to deposit a semiconductor material in the recess 456, 458. The semiconductor material is different from the substrate 202. Accordingly, the channel region of the PMOS device 208, 212 is strained/stressed (e.g., compressive strain) to enable carrier mobility of the device and enhance device performance. The patterned photoresist 440 protecting the NMOS devices 206, 210 is removed prior to the epi process. In the present embodiment, silicon germanium (SiGe) is deposited by an epi process in the recess 456, 458 of the substrate 202 and the fin 214p to form SiGe features 460 in a crystalline state. The SiGe epi process is known in the art, and thus not described in detail herein. The SiGe 460 is formed adjacent the spacers 404 in the PMOS device 208. Further, it is noted that the nitride layer 436 protects the NMOS devices 206, 210 during the SiGe epi process. Additionally, the SiGe 460 is deposited such that it is raised above the surface of the substrate 202. In some embodiments, the SiGe 460 may be in-situ doped with p-type impurities, such as B or In, to form source/drain regions of the PMOS devices 208, 212.

Figure 24:
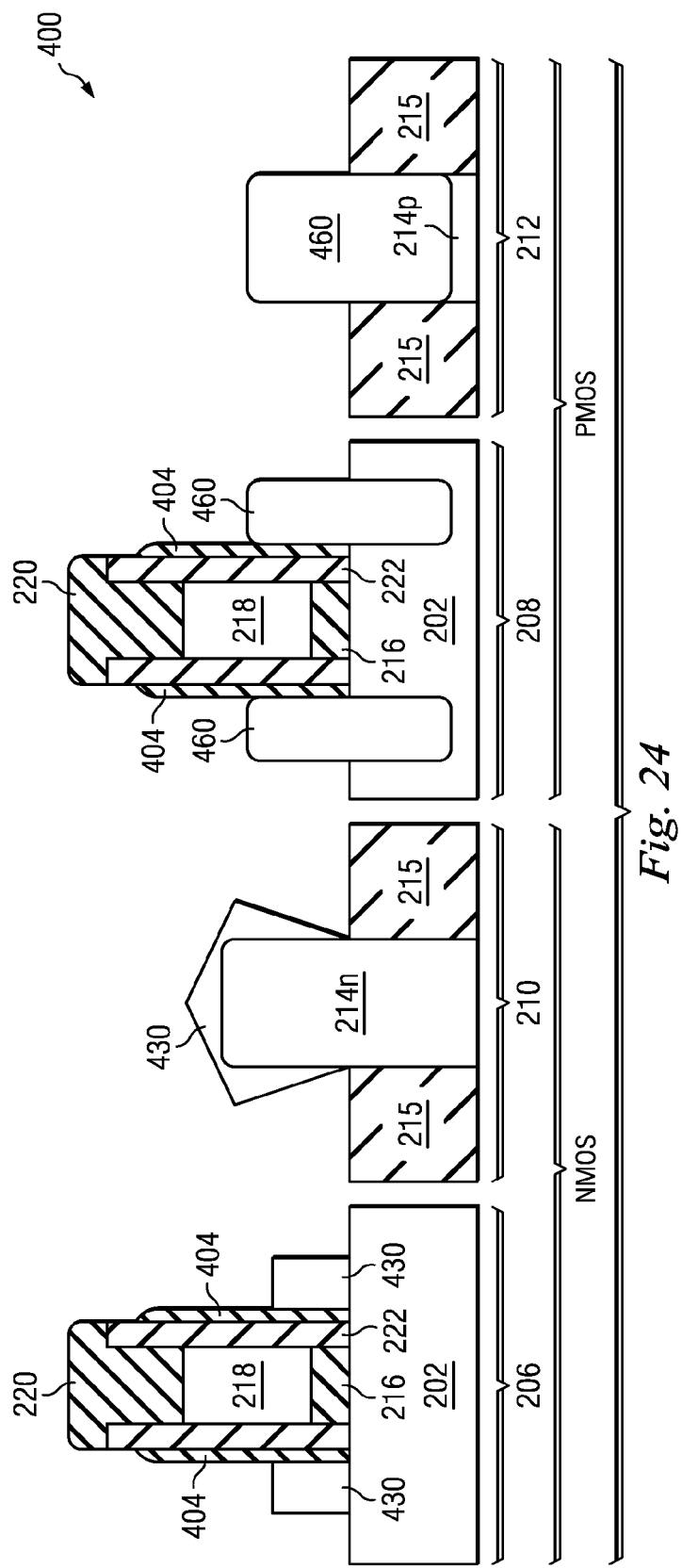

In FIG. 24, an etching process is performed to remove the nitride layer 436 and oxide layer 434 overlying the NMOS devices 206, 210. The etching process includes a wet etching utilizing H3PO4 or other suitable etchant. It is noted that the spacers 404 of the PMOS device 206 are not removed due to high etching selectivity between the doped silicon nitride and undoped silicon nitride. As such, no gap is formed between the gate structure and the epi SiGe 460, and thus the risk of voids being formed in subsequent processing is minimized. The semiconductor device 200 continues with processing to complete fabrication as was discussed above with reference to semiconductor device 200.

Figure 25:
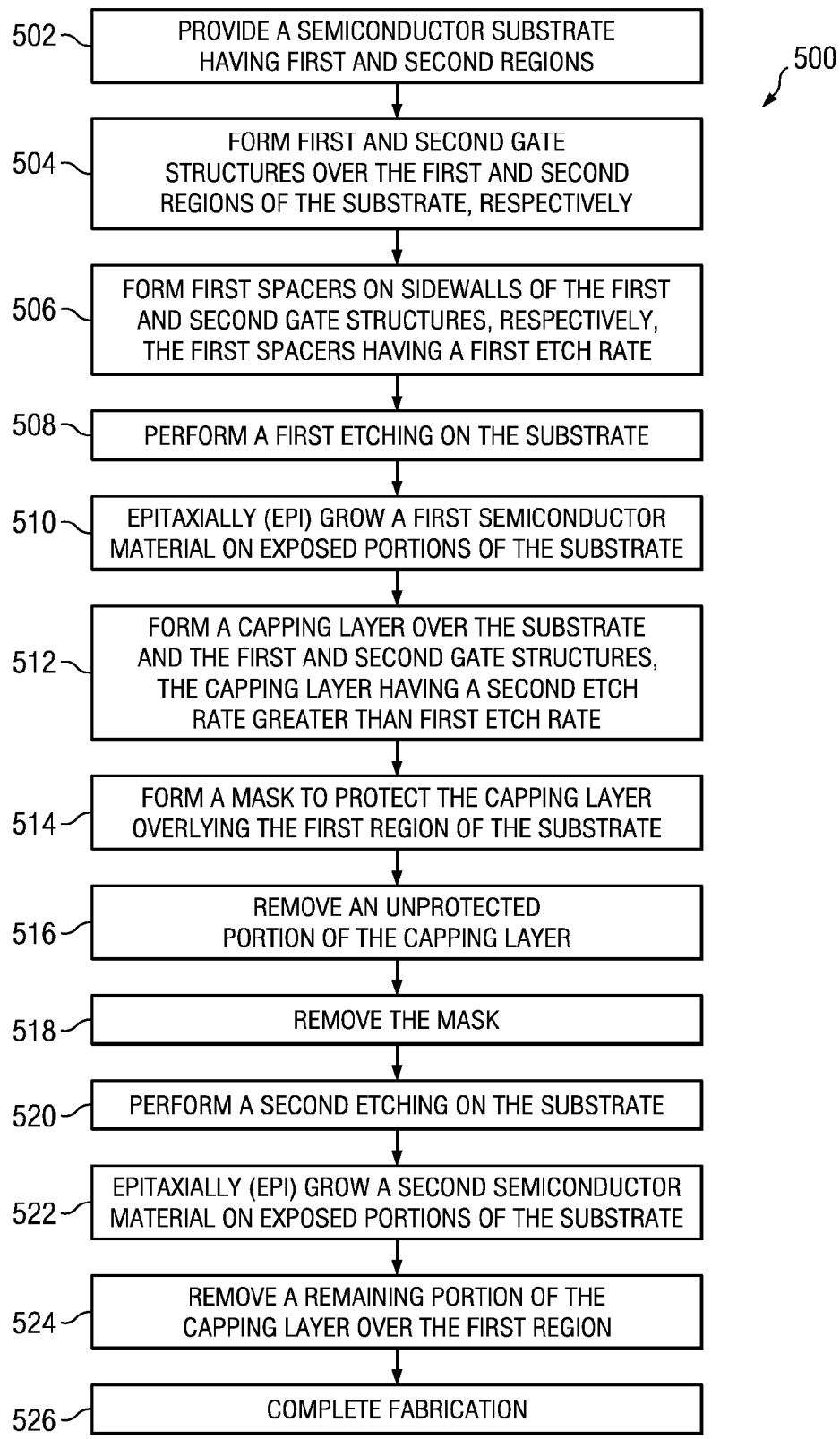
FIG. 25 illustrates a flow chart of still another method of fabricating a semiconductor device with a dual epi process according to various aspects of the present disclosure.

Referring to FIG. 25, illustrated is a flowchart of a method 500 of fabricating a semiconductor device with a dual epitaxial (epi) process according to various aspects of the present disclosure. The method 500 begins with block 502 in which a semiconductor substrate having first and second regions is provided. The method 500 continues with block 504 in which first and second gate structures are formed over the first and second regions of substrate, respectively. The method 500 continues with block 506 in which first spacers are formed on the sidewalls of the first and second gate structures. The first spacers have a first etch rate. The method 500 continues with block 508 in which a first etching is performed on the substrate. The method 500 continues with block 510 in which a first semiconductor is epitaxially grown on exposed portions of the substrate. The method 500 continues with block 512 in which a capping layer is formed over the substrate and the first and second gate structures. The capping layer having a second etch rate greater than the first etch rate. The method 500 continues with block 514 in which a mask is formed to protect the first region of the substrate.

The method 500 continues with block 516 in which an unprotected portion of the capping layer overlying the second region is removed. The method 500 continues with block 518 in which the mask is removed. The method 500 continues with block 520 in which a second etching is performed on the substrate. The method 500 continues with block 522 in which a second semiconductor material is epitaxially grown on exposed portions of the substrate. The method 500 continues with block 524 in which a remaining portion of the capping layer over the first region is removed. The method 500 continues with block 526 in which fabrication of the semiconductor device is completed. The discussion that follows illustrates various embodiment of a semiconductor device that can be fabricated according to the method 500 of FIG. 25

Figure 26:
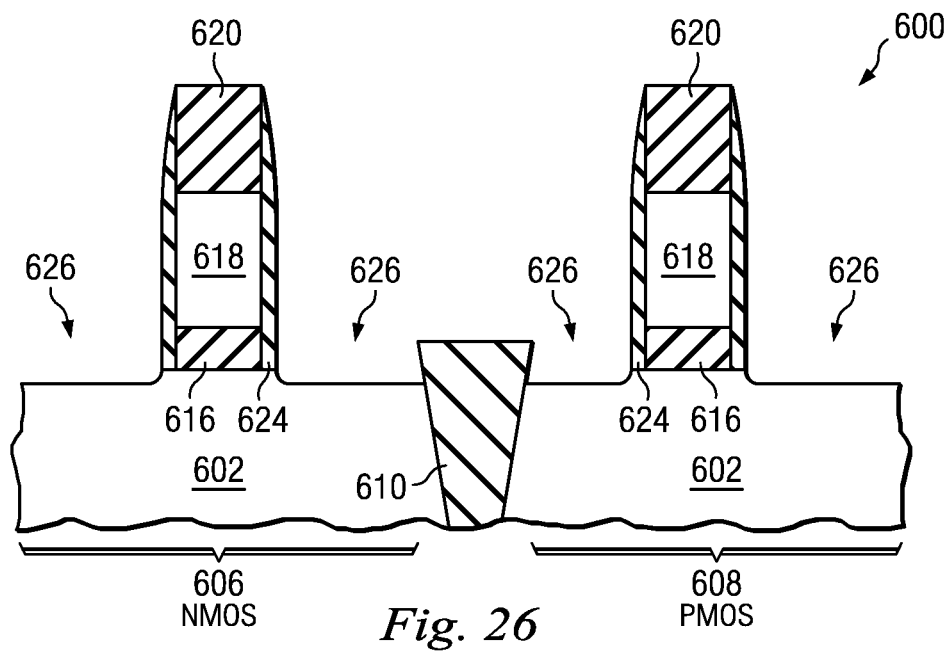
FIGS. 26-33 illustrate cross-sectional views of a semiconductor device at various stages of fabrication according to the method of FIG. 25.

Referring to FIGS. 26-33, illustrated are cross-sectional views of a semiconductor device 600 at various stages of fabrication according to the method 500 of FIG. 25. It should be noted that the semiconductor device 600 may be fabricated by CMOS technology. Accordingly, additional processes may be provided before, during, and after the method 500 of FIG. 25, and that some process are only briefly described herein. In FIG. 26, the semiconductor device 600 includes a substrate 602. The substrate 602 includes a silicon substrate. In another embodiment, the semiconductor substrate 602 may include an epitaxial layer. For example, the substrate 602 may have an epitaxial layer overlying a bulk semiconductor. The substrate 602 further includes doped regions such as p-wells and n-wells.

Various shallow trench isolation (STI) structures 610 are formed in the semiconductor substrate 602 for isolating the various active regions. The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

One or more operational devices are formed in the active regions. The operational devices include n-type and p-type metal-oxide-semiconductor devices (NMOS and PMOS). The NMOS and PMOS devices may be fabricated by CMOS technology processing. The NMOS and PMOS devices may include field-effect transistor (FET) devices. In the present embodiment, the NMOS device 606 and PMOS device 608 each includes a gate structure formed on the semiconductor substrate 602. The gate structure is similar to the gate structures disclosed above in the planar NMOS and PMOS devices. The gate structure includes a gate dielectric 616 and a gate electrode 618. The gate structure may further include a hard mask layer 620 formed on the gate electrode 618.

The semiconductor device 600 may include a sealing layer (not shown) formed on each sidewall of the gate structures. The sealing layer includes silicon nitride and has a thickness ranging from about 5 to about 8 nm. The sealing layer may be formed by CVD, PVD, ALD, plasma enhanced CVD (PECVD), or other suitable technique. In some embodiments, an ion implantation process may be performed to form lightly doped source/drain regions (LDD) in the substrate 602. The LDD regions (not shown) are aligned with the sidewall of the gate structure. The ion implantation process may utilize p-type dopants (e.g., B or In) for the PMOS devices and n-type dopants (P or As) for the NMOS devices.

The semiconductor device 600 includes spacers 624 formed on sidewalls of the gate structures. The spacers 624 are formed by depositing a dielectric layer and performing an dry etching (anisotropic etching) on the dielectric layer. In the present embodiment, the spacers 624 are formed of a silicon nitride layer doped with carbon (SiCN). The carbon concentration may range from about 1% to about 50%. In one embodiment, the carbon concentration is 6%. In other embodiments, the carbon concentration is 10%. The carbon concentration may vary depending on a desired etch rate with respect to a wet etch solution, such as HF, H3PO4, and SPM as will be explained in detail below. The carbon doped silicon nitride layer may be formed by CVD, LPCVD, PECVD, PVD, ALD, or other suitable technique. The spacers 624 may have a thickness ranging from about 5 nm (50 angstrom) to about 15 nm (150 angstrom).

An etching process 626 is performed on exposed portions of the substrate 602. The etching process 626 may include a dry etching, wet etching, or combination thereof. The etching process 626 forms recesses in the substrate 602.

Figure 27:
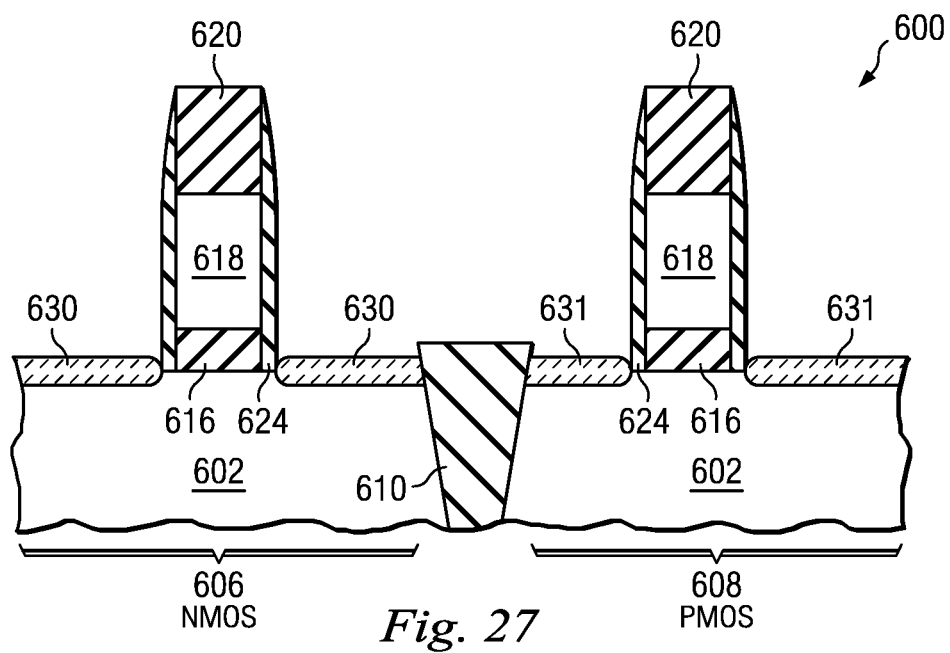

In FIG. 27, an epitaxial (epi) process is performed to grow epi silicon on exposed portions of the silicon substrate 602. It is understood that epitaxial process is known in the art and thus not described in detail herein. In the present embodiment, epi silicon 630 is formed on source/drain regions of the NMOS device 606, and epi silicon 631 is formed on at either side of the gate structure of the PMOS device 608.

Figure 28:
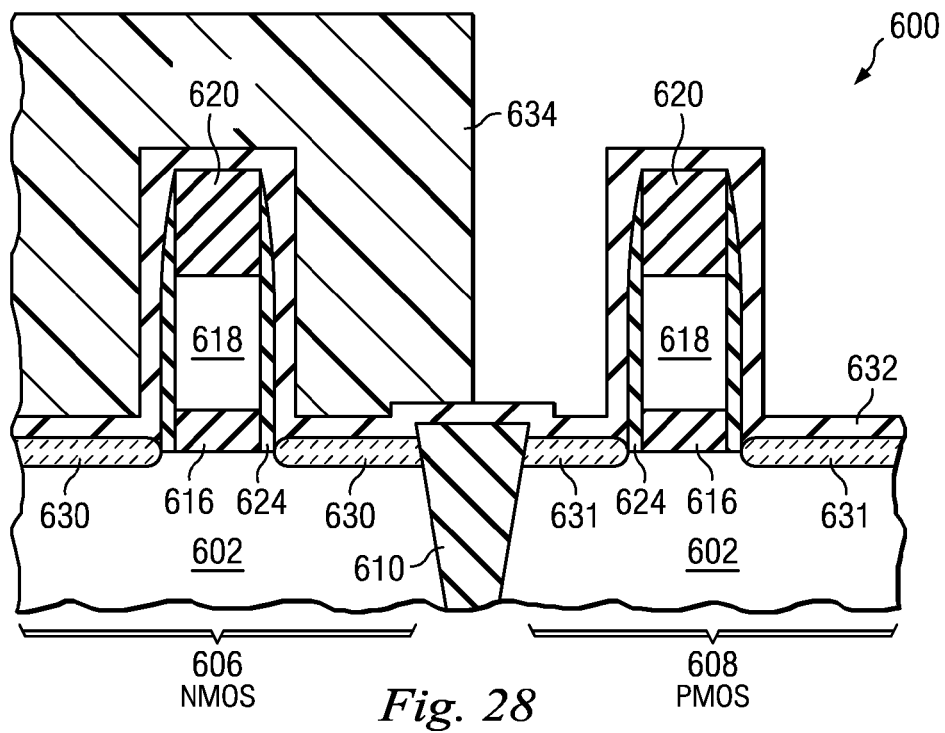

In FIG. 28, a capping layer 632 such as a boron doped silicon nitride (SiBN) or boron nitride (BN) is formed over the substrate 202 including over the gate structures of the NMOS 606 and PMOS 608 devices. The boron concentration may range from about 1% to about 50%. The doping concentration may be selected to achieved a desired etch rate with respect to a wet etch solution, such as HF, H3PO4, and SPM. In the present embodiment, the desired wet etch rate of the capping layer 632 is not less than 5 times the wet etch rate of the spacers 624. In an embodiment, the etch rate of the capping layer 632 is 16 times (16×) the etch rate of the spacers 624 with respect to HF. In other embodiments, the etch rate of the capping layer 632 is 50 times (50×) the etch rate of the spacers 624 with respect to H3PO4. In still other embodiments, the etch rate of the capping layer 632 is 60 times (60×) the etch rate of the spacers 624 with respect to SPM. The capping layer 632 may have a thickness ranging from about 8 nm (80 angstrom) to about 15 nm (150 angstrom).

A patterned photoresist layer 634 is formed to protect a portion of the capping layer 632 overlying the NMOS device 606. The patterned photoresist layer 634 may be formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper techniques such as maskless photolithography, electron-beam writing, ion-beam writing, and molecular imprint. In some embodiments, a bottom anti-reflective coating (BARC) layer may be formed prior to forming the resist layer 634.

Figure 29:
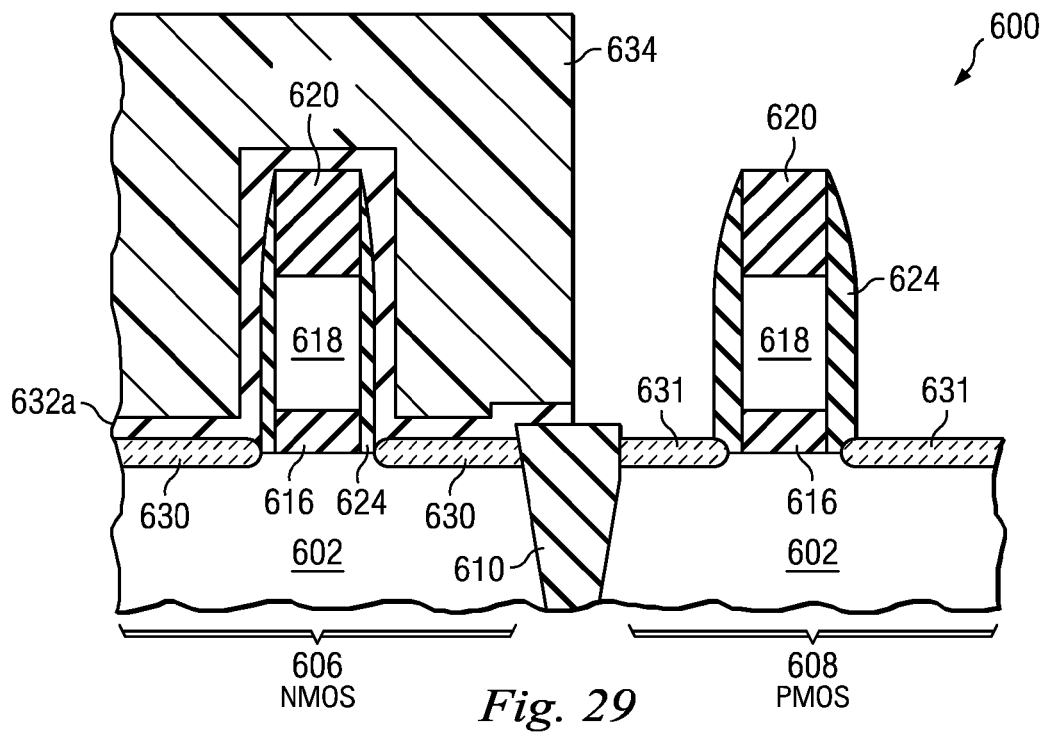

In FIG. 29, an etching process is performed to remove an unprotected portion of the capping layer 632 overlying the PMOS device 608. The patterned photoresist layer 634 protects the capping layer 632a overlying the NMOS device 606. In the present embodiment, the etching process includes a dry etching process, wet etching process, or combination thereof. The etching process may stop at the epi silicon 631. Accordingly, the spacers 624 (SiCN) of the gate structure of the PMOS device 608 are exposed.

Figure 30:
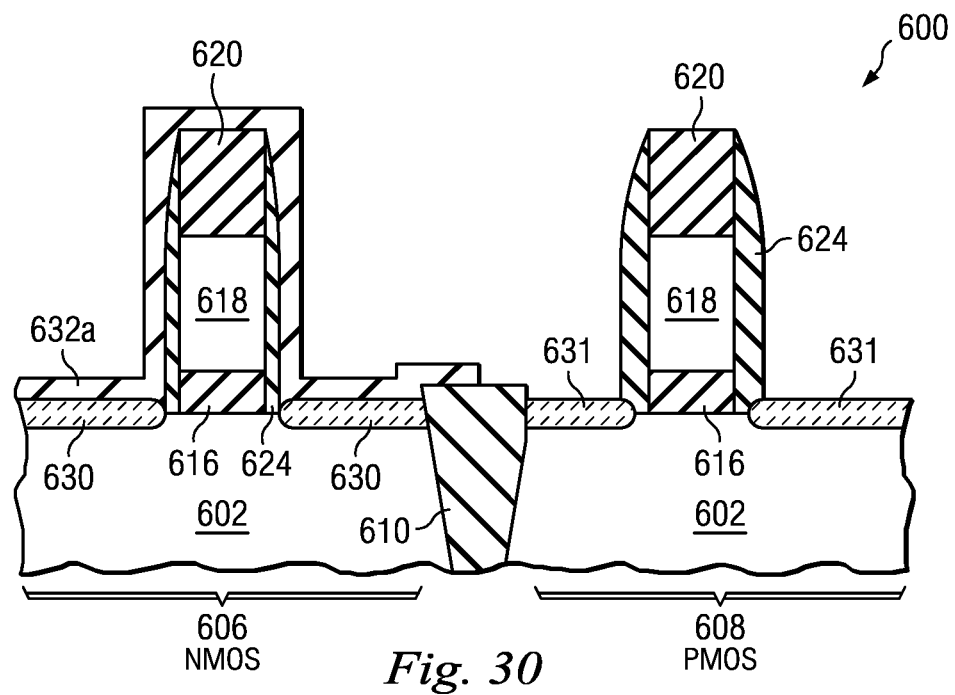
Figure 31:
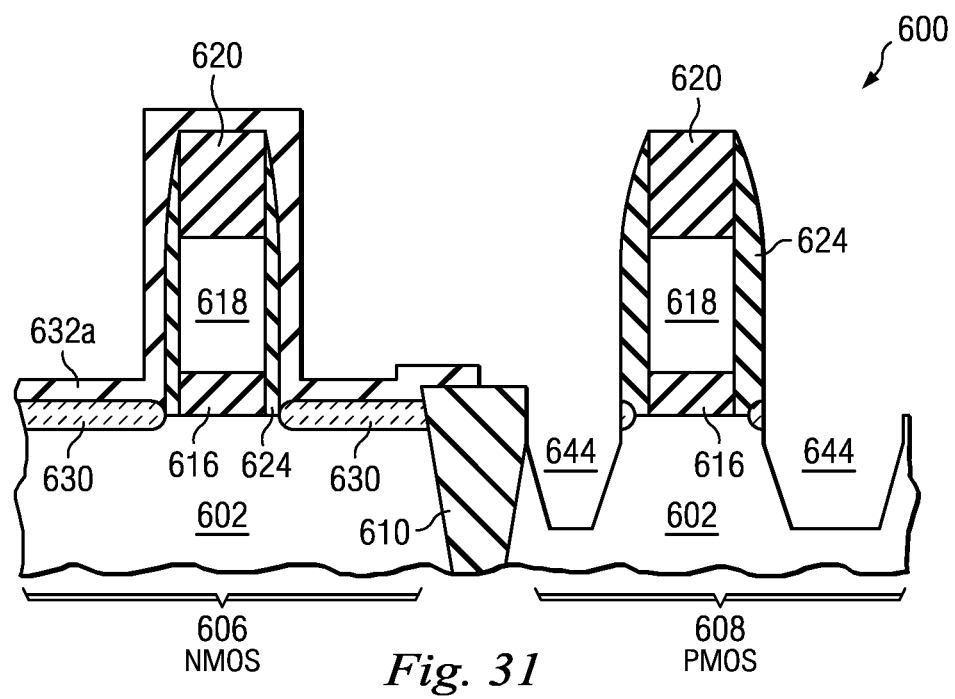

In FIG. 30, the patterned photoresist 634 is removed following the etching process. In FIG. 31, an etching process is performed to form a recess 644 in the substrate 602 of the PMOS device 608. The etching process may include a dry etching, wet etching, or combination thereof. In the present embodiment, the etching process includes a dry etching process that utilizes a combination of HBr/Cl2/O2/He, a pressure ranging from about 1 mT to about 1000 mT, a power ranging from about 50 W to about 1000 W, a bias voltage ranging from about 100 V to about 500 V, an HBr flow rate ranging from about 10 sccm to about 500 sccm, a Cl2 flow rate ranging from about 0 sccm to about 500 sccm, an O2 flow rate ranging from about 0 sccm to about 100 sccm, and an He flow rate ranging from about 0 sccm to about 1000 sccm. The dry etching removes portions of the silicon substrate 602 that are unprotected or exposed. Accordingly, the recess 644 has vertical sidewalls that are aligned with the spacers 624 due to the directional/anisotropic etching. The recess 644 may have a depth ranging from about 400 to about 800 Angstrom (Å). In some embodiments, a pre-cleaning process may be performed to clean the recess 644 with HF or other suitable solution.

Figure 32:
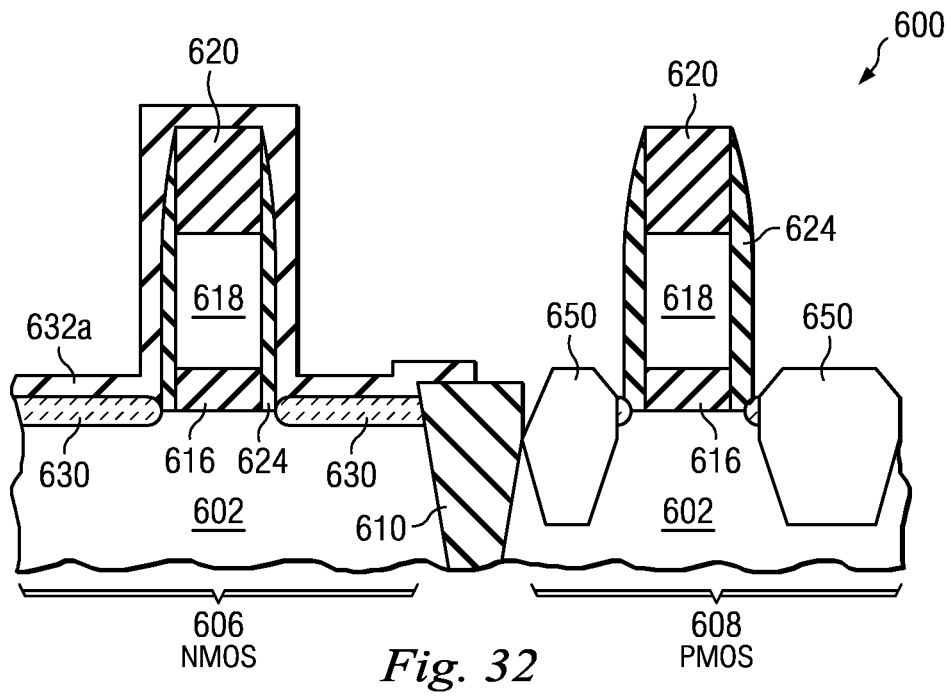

In FIG. 32, a semiconductor material is deposited in the recess 644 to form strained structures of the PMOS device 608. In an embodiment, an epitaxial (epi) process is performed to deposit a semiconductor material in the recess 644. The semiconductor material is different from the substrate 602. Accordingly, the channel region of the PMOS device 608 is strained/stressed (e.g., compressive strain) to enable carrier mobility of the device and enhance device performance. In the present embodiment, silicon germanium (SiGe) is deposited by an epi process in the recess 644 of the substrate 602 to form SiGe features 650 in a crystalline state. The SiGe epi process is known in the art, and thus not described in detail herein. The SiGe 650 is formed adjacent the spacers 624 in the PMOS device 608. Further, it is noted that the capping layer 632a protects the NMOS device 606 during the SiGe epi process. Additionally, the SiGe 650 is deposited such that it is raised above the surface of the substrate 602. In some embodiments, the SiGe 650 may be in-situ doped with p-type impurities, such as B or In, to form source/drain regions of the PMOS device 608.

Figure 33:
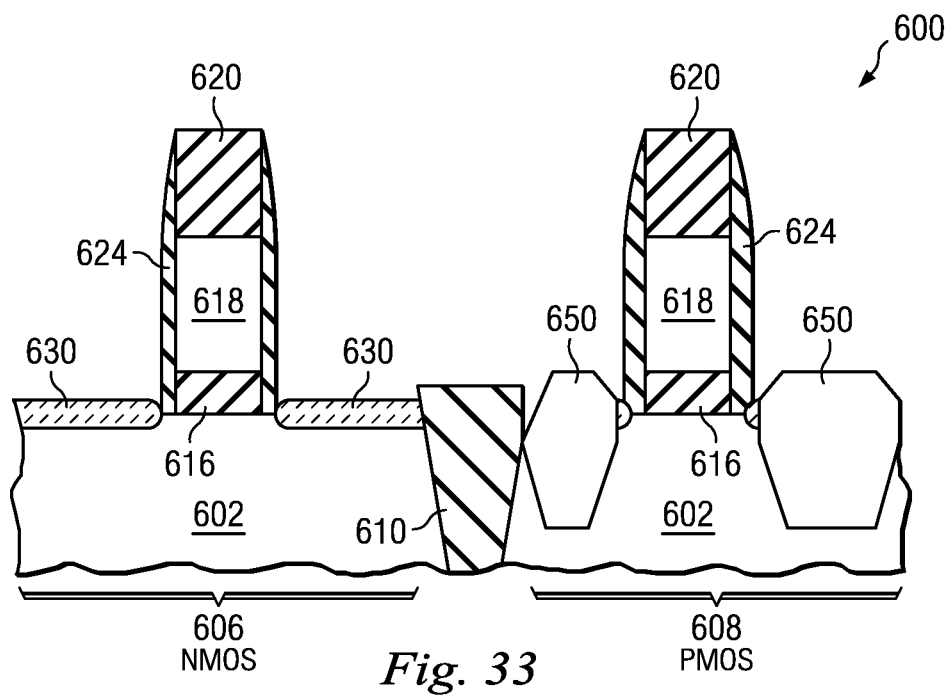

In FIG. 33, an etching process is performed to remove the capping layer 632a overlying the NMOS device 606. The etching process includes a wet etching utilizing HF, H3PO4, or SPM other suitable etchant. It is noted that the spacers 624 of the PMOS device 608 are substantially not removed due to high etching selectivity between the capping layer 632a (SiBN or BN) and spacers 624 (SiCN). As such, critical dimension (CD) variation will be minimized which results in less CESL damage during dummy poly removal (less gate length variation), improved device performance (less variation in Ion and Ioff), and reduced risk of contact (source/drain) to poly short leakage. The semiconductor device 600 continues with processing to complete fabrication as was discussed above with reference to semiconductor device 200.

The semiconductor devices 200, 400, 600 serve only as examples. The semiconductor devices 200, 400, 600 may be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
    forming first and second gate structures over first and second regions of a substrate, respectively;
    forming spacers on sidewalls of the first and second gate structures;
    forming a first capping layer over the first and second gate structures;
    forming a second capping layer over the first capping layer;
    forming a first protection layer over the second region to protect the second gate structure;
    removing the first and second capping layers over the first gate structure;
    removing the first protection layer over the second region;
    epitaxially (epi) growing silicon on exposed portions of the substrate in the first region;
    removing the first and second capping layers over the second gate structure by wet etching, wherein the wet etching selectively removes the first and second capping layers but not the spacers disposed on the sidewalls of the first gate structure;
    after removing the first and second capping layers over the second gate structure by wet etching, forming a third capping layer over the first and second gate structures;
    forming a fourth capping layer over the third capping layer;
    forming a second protection layer over the first region to protect the first gate structure;
    removing the third and fourth capping layers over the second gate structure;
    etching a recess in the substrate at either side of the second gate structure;
    removing the second protection layer over the first region;
    epitaxially (epi) growing silicon germanium (SiGe) to fill the recess; and
    removing the third and fourth capping layers over the first gate structure by wet etching, wherein the wet etching selectively removes the third and fourth capping layers but not the spacers disposed on the sidewalls of the second gate structure.

2. The method of claim 1, further comprising forming first and second silicon fins in third and fourth regions of the substrate, respectively, wherein the first and second silicon fins are each isolated by a shallow trench isolation (STI);
    wherein the first silicon fin undergoes processing that is performed on the first gate structure such that epi Si is grown on an exposed portion of the first silicon fin; and
    wherein the second silicon fin undergoes processing that is performed on the second gate structure such that the second silicon fin is etched thereby forming another recess that is surrounded by the STI, and epi SiGe is grown to fill the another recess thereby forming a SiGe fin.

3. The method of claim 1, wherein the first gate structure is part of an NMOS device and wherein the second gate structure is part of a PMOS device.

4. The method of claim 1, wherein the spacers are formed of silicon nitride doped with carbon;
    wherein the first and third capping layers are formed of silicon oxide; and
    wherein the second and fourth capping layers are formed of silicon nitride not doped with carbon.

5. The method of claim 1, wherein one of the first and second capping layers includes an oxide material and the other of the first and second capping layers includes a nitride material.

6. The method of claim 1, further comprising forming a sealing layer on the sidewalls of the first and second gate structures prior to forming the spacers on the sidewalls of the first and second gate structures.

7. A method comprising:
    forming first and second gate structures over first and second regions of a substrate, respectively;
    forming spacers on sidewalls of the first and second gate structures;
    forming a first capping layer over the first and second gate structures;
    forming a second capping layer over the first capping layer;
    removing the first and second capping layers over the first gate structure;
    epitaxially growing a first semiconductor material on exposed portions of the substrate in the first region;
    removing the first and second capping layers over the second gate structure;
    after removing the first and second capping layers over the second gate structures, forming a third capping layer over the first and second gate structures;
    forming a fourth capping layer over the third capping layer;
    removing the third and fourth capping layers over the second gate structure; and
    removing the third and fourth capping layers over the first gate structure.

8. The method of claim 7, wherein removing the first and second capping layers over the first gate structure includes removing the first and second capping layers by an etching process, wherein the etching process selectively removes the first and second capping layers but not the spacers disposed on the sidewalls of the first gate structure.

9. The method of claim 7, further comprising forming a fin structure over the second region of the substrate,
    wherein forming the third capping layer over the first and second gate structures includes forming the third capping layer over the fin structure, and
    wherein removing the third and fourth capping layers over the second gate structure include removing the third and fourth capping layers over the fin structure.

10. The method of claim 9, further comprising removing a portion of the fin structure to form a recess, and
    wherein epitaxially growing the second semiconductor material on exposed portions of the substrate in the second region includes epitaxially growing the second semiconductor material in the recess.

11. The method of claim 7, wherein the first and third capping layers are formed of a first material and the second and fourth capping layers are formed of a second material.

12. The method of claim 11, wherein one of the first and second materials includes an oxide material and the other of the first and second materials includes a nitride material.

\* \* \* \* \*